(12) United States Patent
Tsuji

(10) Patent No.: US 9,234,939 B2
(45) Date of Patent: Jan. 12, 2016

(54) SEMICONDUCTOR DEVICE

(71) Applicant: SOCIONEXT INC., Yokohama-shi, Kanagawa (JP)

(72) Inventor: Masayuki Tsuji, Fussa (JP)

(73) Assignee: SOCIONEXT INC., Yokohama (JP)

( * ) Notice: Subject to any disclaimer, the term of this patent is extended or adjusted under 35 U.S.C. 154(b) by 114 days.

(21) Appl. No.: 13/780,933

(22) Filed: Feb. 28, 2013

(65) Prior Publication Data

US 2013/0283111 A1    Oct. 24, 2013

(30) Foreign Application Priority Data

Apr. 23, 2012  (JP) ................ 2012-097481
Oct. 4, 2012   (JP) ................ 2012-222379

(51) Int. Cl.
*G01R 31/28*      (2006.01)
*G01R 31/3177*    (2006.01)
*G01R 31/3185*    (2006.01)

(52) U.S. Cl.
CPC .... *G01R 31/3177* (2013.01); *G01R 31/318536* (2013.01)

(58) Field of Classification Search
CPC .................. G01R 31/3177; G01R 31/318536
USPC ......................................................... 714/726
See application file for complete search history.

(56) References Cited

U.S. PATENT DOCUMENTS 7,793,180 B1 *   9/2010   Shrivastava ................... 714/726

FOREIGN PATENT DOCUMENTS

| JP | 2004-157029 A | 6/2004 |
| JP | 2006-337289 A | 12/2006 |
| JP | 2010-531001 A | 9/2010 |
| WO | WO 2008/140790 A2 | 11/2008 |

* cited by examiner

*Primary Examiner* — Sam Rizk
(74) *Attorney, Agent, or Firm* — Arent Fox LLP

(57) ABSTRACT

A semiconductor device includes a scan chain that scans out latch signals of a plurality of latches; a first switch that selects any one of an output signal of a combinational circuit and a signal of the scan chain; a first latch that is inserted into the scan chain and receives an output signal of the first switch; a second latch that receives an output signal of the combinational circuit; and a second switch that selects any one of a latch signal of the first latch and a latch signal of the second latch and supplies the selected one to a combinational circuit in a following stage.

16 Claims, 26 Drawing Sheets

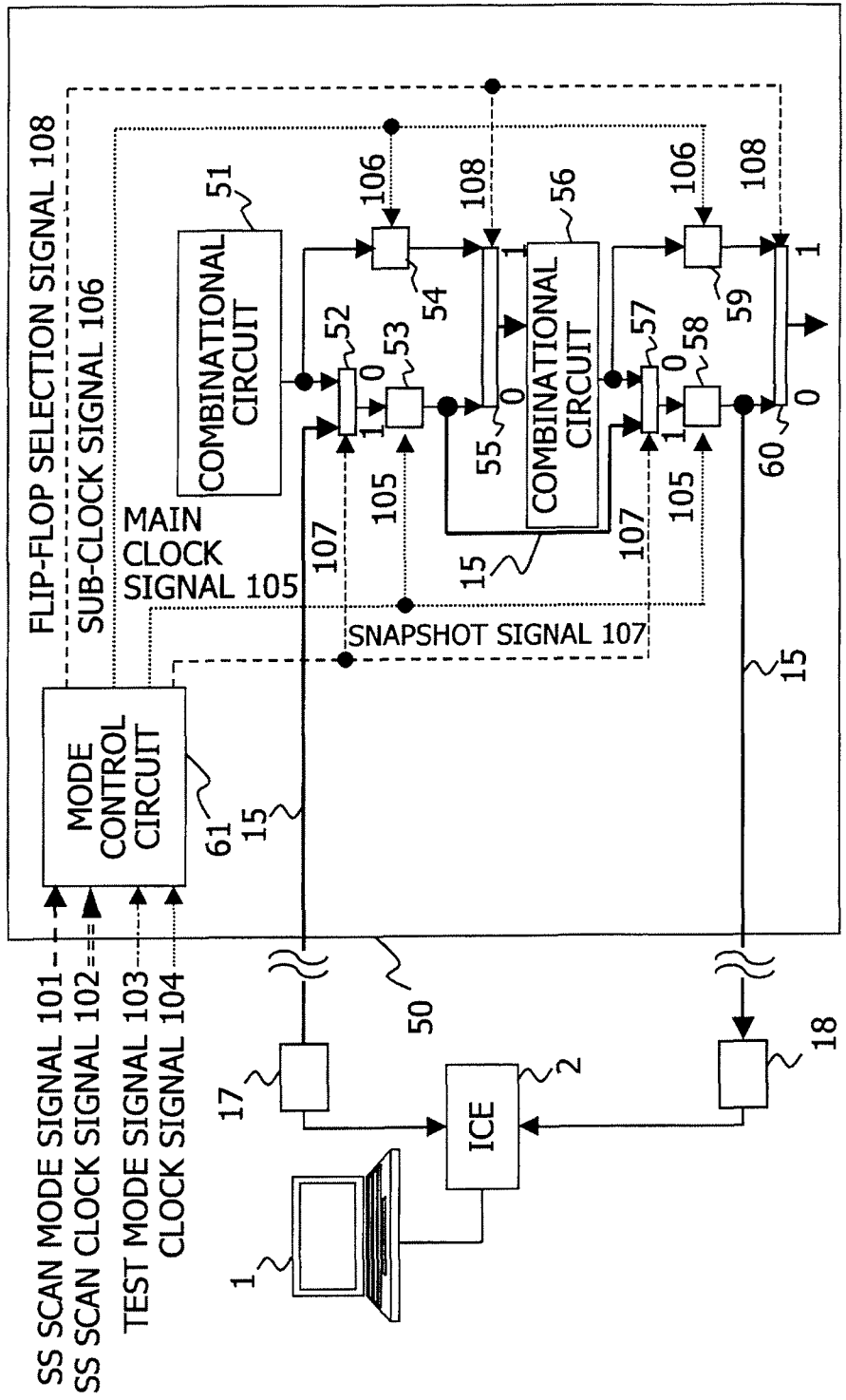

FIG.5A

| OPERATION MODE | SS SCAN MODE SIGNAL | SWITCHING CONDITION OF OPERATION MODE | OPERATION MODE AFTER SWITCHING |
|---|---|---|---|
| IDLE MODE (IDLE) | 00 | SNAPSHOT START SIGNAL = L | IDLE |
|  |  | SNAPSHOT START SIGNAL = H | SS |
| SNAPSHOT MODE (SS) | 10 | SINGLE CLOCK ELAPSING | SOUT |
| SCAN-OUT MODE (SOUT) | 11 | TEST MODE SIGNAL 103 = H | SOUT |
|  |  | TEST MODE SIGNAL 103 = L | RET |
| RETURN MODE (RET) | 01 | SINGLE CLOCK ELAPSING | IDLE |

FIG.5B

| OUTPUT SIGNAL OF MODE CONTROL CIRCUIT 61 | OPERATION MODE (SS SCAN MODE SIGNAL) | | | |
|---|---|---|---|---|
|  | IDLE(00) | SS(10) | SOUT(11) | RET(01) |
| MAIN CLOCK SIGNAL 105 | CLOCK SIGNAL 104 | CLOCK SIGNAL 104 | SS SCAN CLOCK SIGNAL 102 | SS SCAN CLOCK SIGNAL 102 |
| SUB-CLOCK SIGNAL 106 | L | L | CLOCK SIGNAL 104 | CLOCK SIGNAL 104 |
| SNAPSHOT SIGNAL 107 | TEST MODE SIGNAL 103 | H | H | L |
| FLIP-FLOP SELECTION SIGNAL 108 | L | L | H | H |

SNAPSHOT MODE (1)

SNAPSHOT MODE (2)

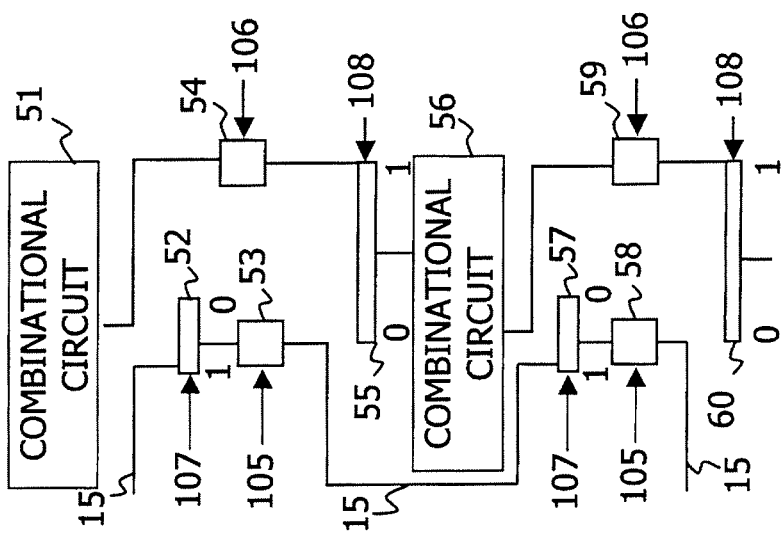
FIG.9A SCAN-OUT MODE (1)
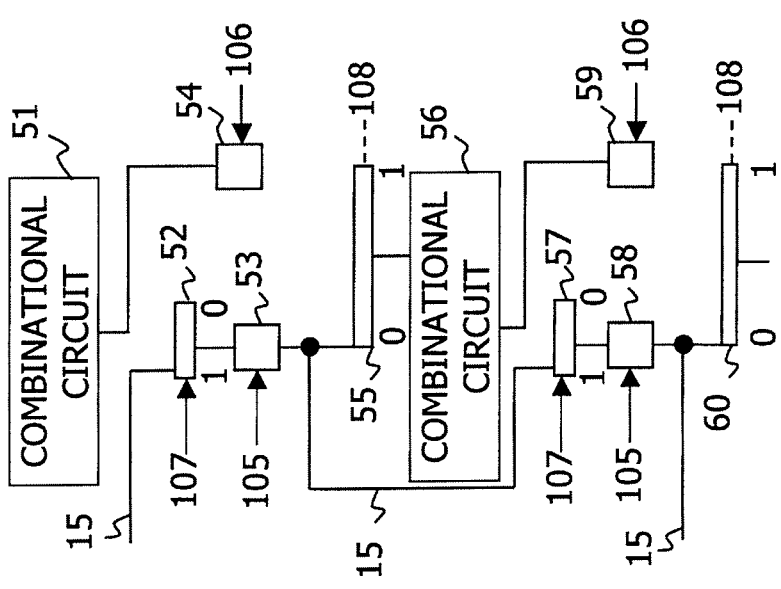
FIG.9B SCAN-OUT MODE (2)

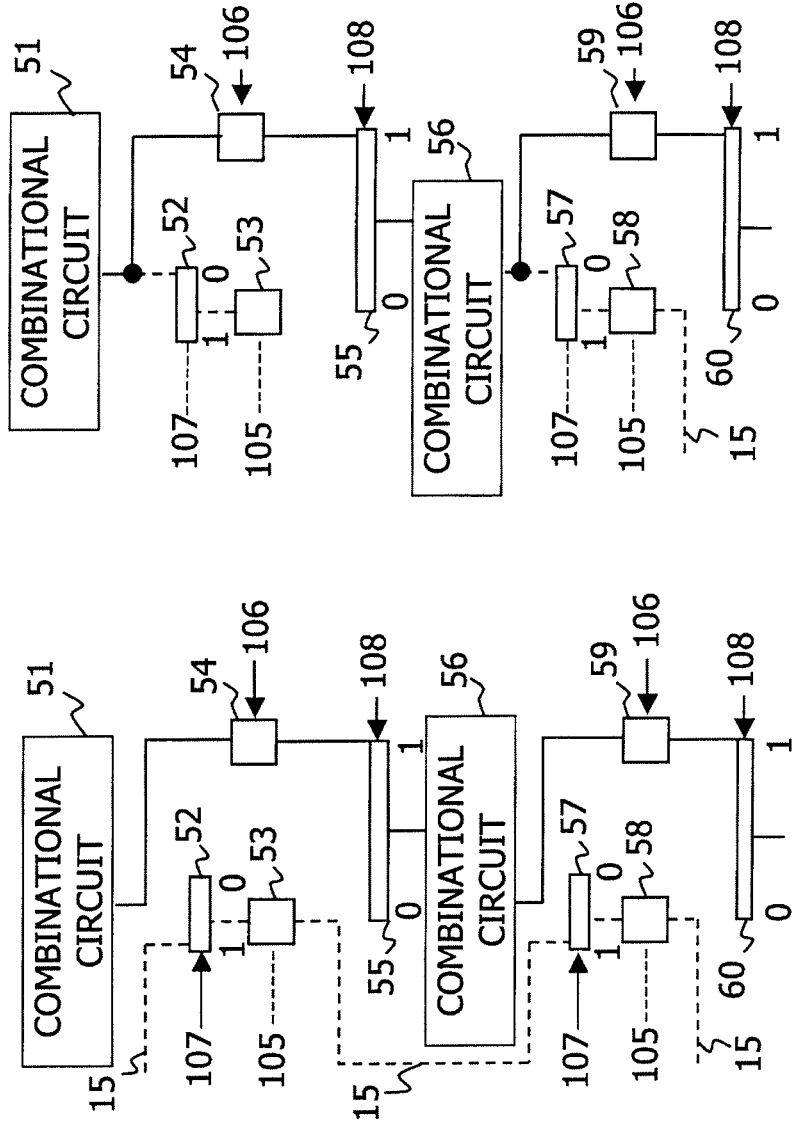

FIG.20

| OPERATION MODE | SS SCAN MODE SIGNAL | SWITCHING CONDITION OF OPERATION MODE | OPERATION MODE AFTER SWITCHING |
|---|---|---|---|
| IDLE MODE (IDLE) | 000 | INTERNAL SNAPSHOT START SIGNAL 402 = L | IDLE |
| | | INTERNAL SNAPSHOT START SIGNAL 402 = H SCAN-IN SIGNAL = L | SS |
| | | SNAPSHOT START SIGNAL = H SCAN-IN SIGNAL = H | SET |
| SNAPSHOT MODE (SS) | 010 | SINGLE CLOCK ELAPSING | SOUT |
| SCAN-OUT MODE (SOUT) | 011 | TEST MODE SIGNAL 103 = H | SOUT |
| RETURN MODE (RET) | 001 | TEST MODE SIGNAL 103 = L | RET |
| | | SINGLE CLOCK ELAPSING | IDLE |
| SET MODE (SET) | 100 | SNAPSHOT START SIGNAL = H SCAN-IN SIGNAL = H | IDLE |

FIG.21

| OUTPUT SIGNAL OF MODE CONTROL CIRCUIT 61 | OPERATION MODE (SS SCAN MODE SIGNAL) | | | | | |
|---|---|---|---|---|---|---|
| | IDLE(000) | SS(010) | SOUT(011) | RET(001) | SET(100) |
| MAIN CLOCK SIGNAL 105 | CLOCK SIGNAL 104 | CLOCK SIGNAL 104 | SS SCAN CLOCK SIGNAL 102 | SS SCAN CLOCK SIGNAL 102 | CLOCK SIGNAL 104 |
| SUB-CLOCK SIGNAL 106 | L | L | CLOCK SIGNAL 104 | CLOCK SIGNAL 104 | SS SCAN CLOCK SIGNAL 102 |
| SNAPSHOT SIGNAL 107 | TEST MODE SIGNAL 103 | H | H | L | L |
| FLIP-FLOP SELECTION SIGNAL 108 | L | L | H | H | L |
| ADDRESS SET SIGNAL 403 | L | L | L | L | H |

SEMICONDUCTOR DEVICE

CROSS-REFERENCE TO RELATED APPLICATIONS

This application is based upon and claims the benefit of priority of the prior Japanese Patent Application No. 2012-097481, filed on Apr. 23, 2012, and the Japanese Patent Application No. 2012-222379, filed on Oct. 4, 2012, the entire contents of which are incorporated herein by reference.

FIELD

The present invention relates to a semiconductor device.

BACKGROUND

In order to examine whether or not a large scale integration (LSI) circuit is properly operated at the time of LSI batch release testing, a test using a scan chain is performed. For this test, a subsidiary flip-flop (hereinafter, referred to as a subsidiary FF) for latching output signals of each flip-flop (hereinafter, referred to as a main FF) in a test target circuit is provided, and each subsidiary FF is connected using a snapshot scan chain (hereinafter, referred to as an SS scan chain). In addition, the subsidiary FF latches an output signal of the main FF at an arbitrary timing, and the output signal of the subsidiary FF is externally output through the SS scan chain, so that troubleshooting is performed without interrupting an internal operation of the LSI.

Followings are related prior arts; Japanese Laid-open Patent Publication No. 2010-531001, Japanese Laid-open Patent Publication No. 2004-157029, and Japanese Laid-open Patent Publication No. 2006-337289.

The aforementioned subsidiary FF is only for latching an output signal of the main FF, so that more area on the chip as appropriate is used to interconnect a snapshot scan chain. Providing the LSI with the subsidiary FF and the SS scan chain increases cost, which is not preferable.

SUMMARY

According to an aspect of the embodiments, a semiconductor device includes a scan chain that scans out latch signals of a plurality of latches; a first switch that selects any one of an output signal of a combinational circuit and a signal of the scan chain; a first latch that is inserted into the scan chain and receives an output signal of the first switch; a second latch that receives an output signal of the combinational circuit; and a second switch that selects any one of a latch signal of the first latch and a latch signal of the second latch and supplies the selected one to a combinational circuit in a following stage.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 4 is a diagram illustrating a configuration of the internal circuit according to the first embodiment.

FIGS. 5A and 5B are diagrams illustrating operation modes according to the first embodiment.

FIGS. 9A and 9B are diagrams illustrating operational states of the scan-out mode according to the first embodiment.

FIGS. 10A and 10B are diagrams illustrating operational states of the return mode according to the first embodiment.

FIG. 20 is a diagram illustrating a switching condition of the operation mode of the memory interface according to the fourth embodiment.

FIG. 21 is a diagram illustrating an output signal of the mode control circuit according to the fourth embodiment.

DESCRIPTION OF EMBODIMENTS

Hereinafter, embodiments of the present invention will be described with reference to the accompanying drawings.

Figure 1:
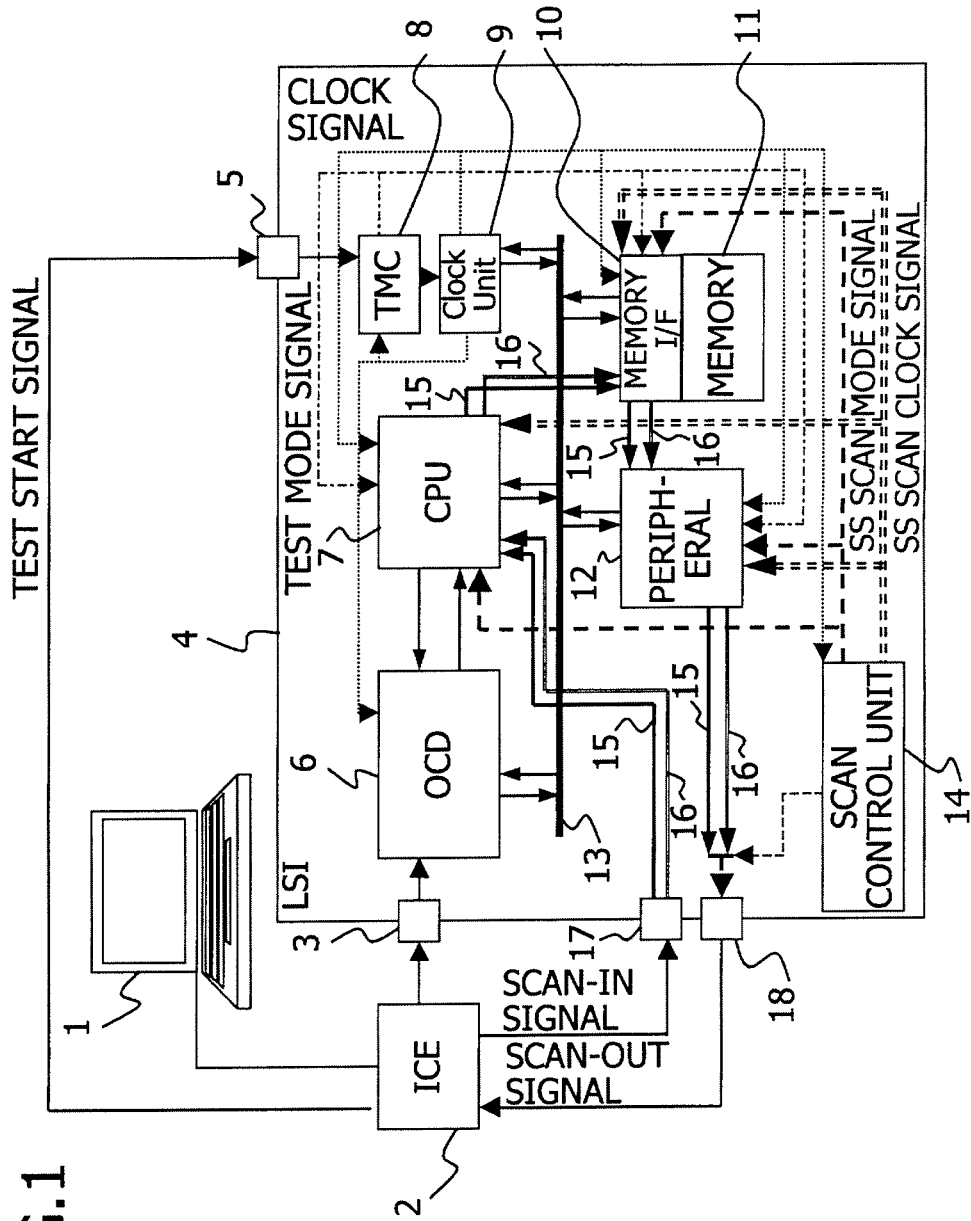
FIG. 1 is a diagram illustrating a configuration example of an LSI.

FIG. 1 is a diagram illustrating a configuration example of an LSI. The LSI 4 of FIG. 1 is connected to a debug tool 1 such as a host personal computer (PC) through an in-circuit emulator (ICE) 2. The debug tool 1 outputs a scan-in signal and a test start signal, which will be described below, to the LSI 4 through the ICE 2. In addition, the debug tool 1 is supplied with a scan-out signal, which will be described below, from the LSI 4.

The LSI 4 further includes an on-chip debugger (OCD) 6, a CPU 7, a test mode controller (TMC) 8 that generates a test mode signal based on the test start signal input from the debug tool 1 through the ICE 2 and an external terminal 5, a clock unit 9 that generates a clock signal, a memory interface 10, a memory 11, a peripheral functional circuit 12, and an internal bus 13. In addition, the LSI 4 has a scan control unit 14 that outputs a snapshot scan clock signal (hereinafter, referred to as an SS scan clock signal) and a snapshot scan mode signal (hereinafter, referred to as an SS scan mode signal), which will be described below.

In addition, the LSI 4 includes a main scan chain interconnect 15 for connecting a main FF group provided between combinational circuits (logic circuits) in the CPU 7, the memory interface 10 and the peripheral functional circuit 12, and an SS scan chain interconnect 16 to connect a subsidiary FF group. A subsidiary FF of the subsidiary FF group is provided to correspond to a main FF of the main FF group, and latches the output signal of the combinational circuit latched on the main FF. That is, the LSI 4 is provided with an SS scan chain having a plurality of subsidiary FFs and an SS scan chain interconnect 16 for connecting a plurality of subsidiary FFs along with a scan chain having a plurality of main FFs and a main scan chain interconnect 15 for connecting a plurality of the main FFs.

Figure 2:
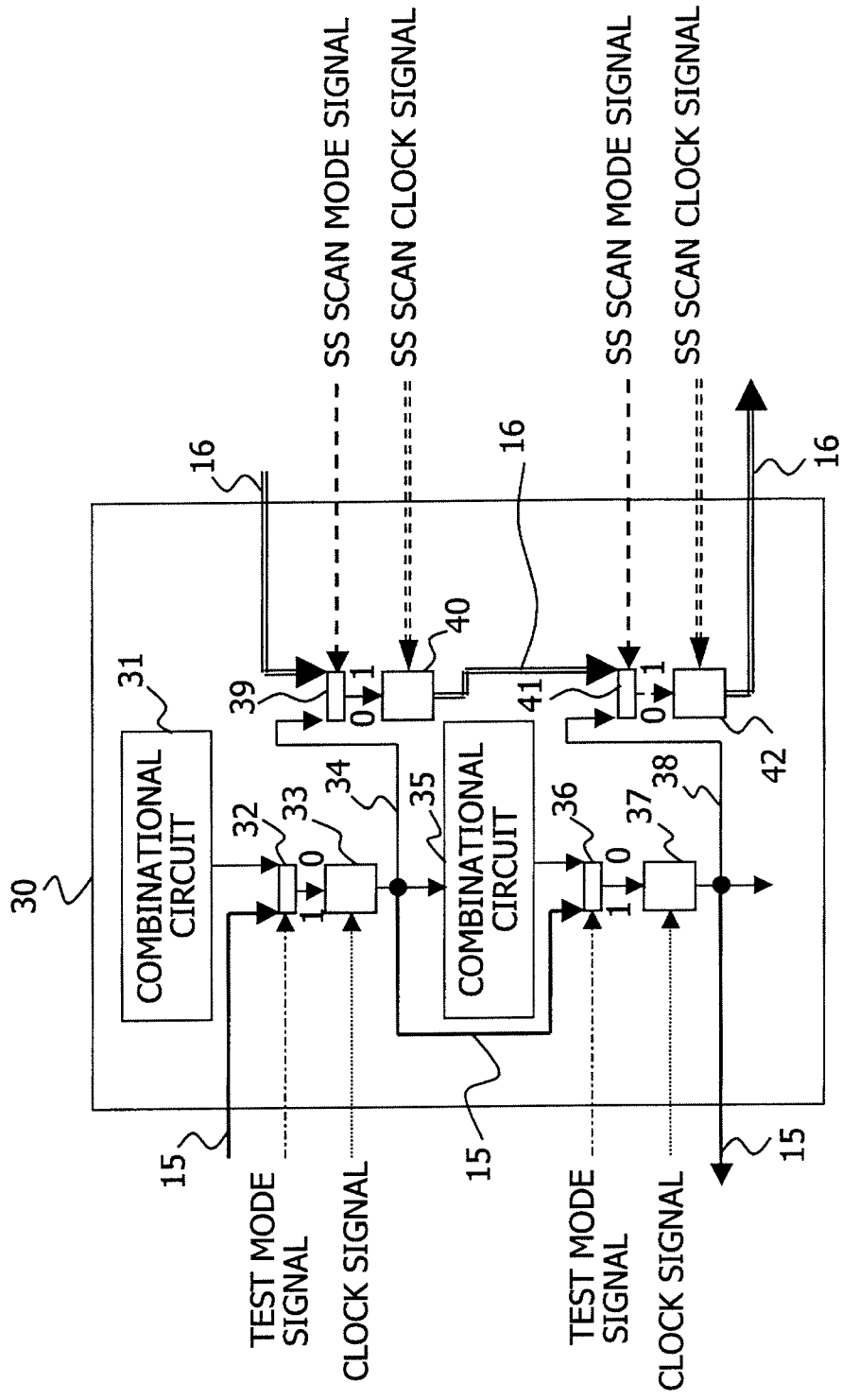
FIG. 2 is a diagram illustrating a configuration of the internal circuit for reading an internal state of the LSI.

FIG. 2 is a diagram illustrating a configuration of the internal circuit for reading an internal state of the LSI. FIG. 2 illustrates a part of the internal circuit 30 in the CPU 7, the peripheral functional circuit 12, and the memory interface 10. The internal circuit 30 has combinational circuits 31 and 35 and main FFs 33 and 37. In a normal operation, the main FF 33 latches the output signal of the combination circuit 31 in synchronization with a clock signal, and the main FF 37 latches the output signal of the combinational circuit 35 in synchronization with a clock signal.

In order to output data of the main FF for indicating an internal state of the LSI 4 from a scan-out terminal 18 through the main scan chain interconnect 15, the internal circuit 30 further has a main scan chain interconnect 15 for connecting the main FFs 33 and 37, a switch 32 provided between the combinational circuit 31 and the main FF 33 to select any one of the signal of the main scan chain interconnect 15 and the output signal of the combinational circuits 31 in response to the test mode signal, and a switch 36 provided between the combinational circuit 35 and the main FF 37 to select any one of the signal of the main scan chain interconnect 15 and the output signal of the combinational circuits 35 in response to the test mode signal.

In this internal circuit 30, for troubleshooting, the switches 32 and 36 select a signal of the main scan chain interconnect 15, and the data of the main FFs 33 and 37 is output from the scan-out terminal 18 through the main scan chain interconnect 15. However, in this case, since the switches 32 and 36 select the scan chain interconnect 15, a normal operation using the combinational circuits 31 and 35 and the main FFs 33 and 37 is interrupted.

In this regard, in order to allow the combinational circuit and the main FF to continuously perform the normal operation and extract an internal state of the internal circuit 30 at an arbitrary timing, the internal circuit 30 of FIG. 2 also includes subsidiary FFs 40 and 42, an SS scan chain interconnect 16 for connecting the subsidiary FFs 40 and 42, a switch 39 that select any one of the signal of the SS scan chain interconnect 16 and the output signal of the main FF 33 in response to the SS scan mode signal between the main FF 33 and the subsidiary FF 40, and a switch 41 that select any one of the signal of the SS scan chain interconnect 16 and the output signal of the main FF 37 in response to the SS scan mode signal between the main FF 37 and the subsidiary FF 42.

In a normal operation, the switches 39 and 41 select the "0" side based on the SS scan mode signal. The subsidiary FF 40 latches the latch signal of the main FF 33 in synchronization with the SS scan clock signal, and the subsidiary FF 42 latches the latch signal of the main FF 37 in synchronization with the SS scan clock signal. In addition, when the switches 39 and 41 select a signal of the SS scan chain interconnect 16 in a scan test, the data of the subsidiary FFs 40 and 42 is output through the SS scan chain interconnect 16. In this configuration, the internal circuit 30 can read an internal state of the main FFs 33 and 37 of the LSI 4 at an arbitrary timing using the SS scan chain interconnect 16 of the subsidiary FFs 33 and 37 while a normal operation using the combinational circuits 31 and 35 and the main FFs 33 and 37 is continuously performed.

Using the configuration of FIG. 2, a scan test is performed to read an internal state of the LSI 4. In the scan test, first, as an input signal for the scan test, a scan-in signal is input to the main FFs 33 and 37 through the ICE 2 and the scan-in terminal 17 from the debug tool 1. That is, initially, a test mode signal having a high level H is generated by the test mode controller 8 in response to the input test start signal. The switches 32 and 36 select a signal of the main scan chain interconnect 15 in response to this test mode signal. The switch 32 inputs the scan-in signal to the main FF 33 through the main scan chain interconnect 15, and the switch 36 inputs the scan-in signal to the main FF 37 through the main scan chain interconnect 15.

Next, the LSI 4 is normally operated. Specifically, first, in order to cause the switch 32 to select the output signal of the combinational circuit 31 (switch "0" side) and to cause the switch 36 to select the output signal of the combinational circuit 35 (switch "0" side), the test mode controller 8 sets the test mode signal to a low level L. A desired input test pattern is input to the LSI 4, and a clock signal is generated by the clock unit 9, so that the internal circuit 30 performs a normal operation using the combinational circuits 31 and 35 and the main FFs 33 and 37. As a result, the main FF 33 latches the output signal of the combinational circuit 31 in synchronization with the clock signal, and the main FF 37 latches the output signal of the combinational circuit 35 in synchronization with the clock signal.

In order to cause the switch 39 to select the latch signal of the main FF 33 (switch "0" side) and to cause the switch 41 to select the latch signal of the main FF 37 (switch "0" side), the scan control unit 14 sets the scan mode signal to a low level L and generates the SS scan clock signal. The subsidiary FF 40 latches the latch signal of the main FF 33 in synchronization with the SS scan clock signal, and the subsidiary FF 42 latches the latch signal of the main FF 37 in synchronization with the SS scan clock signal.

At an arbitrary timing, the scan control unit 14 causes the SS scan mode signal having a high level H to be output. As a result, the switches 39 and 41 select a signal of the SS scan chain interconnect 16 (switch "1" side). The subsidiary FF 40 latches the latch signal of the subsidiary FF in a preceding stage (not illustrated), and the subsidiary FF 42 latches the latch signal of the subsidiary FF 40 in response to the SS scan clock signal.

In this manner, for overall subsidiary FFs connected using the SS scan chain interconnect 16, the latch signals of the subsidiary FFs of the preceding stage sequentially are latched to the subsidiary FFs of the following stage, so that data indicating an internal state of the LSI 4 is output as a scan-out signal from the scan-out terminal 18 through the SS scan chain interconnect 16. In addition, while the latch signal of the subsidiary FF is scanned out through the SS scan chain interconnect 16, the switch 32 selects the output of the combinational circuit 31 and the switch 36 selects the output signal of the combinational circuits 35. Therefore, the internal circuit 30 can continuously perform the normal operation using the combinational circuits 31 and 35 and the main FFs 33 and 37.

In this manner, in FIG. 2, data indicating an internal state of the LSI 4 is read at an arbitrary timing while the internal circuit 30 continuously performs the normal operation. However, the subsidiary FFs 40 and 42 are circuits dedicated to the scan test, and such installation of the subsidiary FF in the LSI 4 increases cost, which is not preferable. In addition, in FIG. 2, if there is a failure in the interconnect between the main FF and the subsidiary FF even when the main FFs 33 and 37 and the subsidiary FFs 40 and 42 are normally operated by themselves, it is difficult to properly latch the subsidiary FFs 40 and 42. Therefore, there is a risk that the data of the subsidiary FF output from the scan-out terminal 18 is not correct.

First Embodiment

In this regard, according to the first embodiment, without the SS scan chain interconnect 16 of FIGS. 1 and 2, the internal state of the LSI is read from the scan-out terminal through the main scan chain interconnect using a semiconductor device of FIGS. 3 and 4 as described below while the internal circuit is continuously operated using the subsidiary FF.

Figure 3:
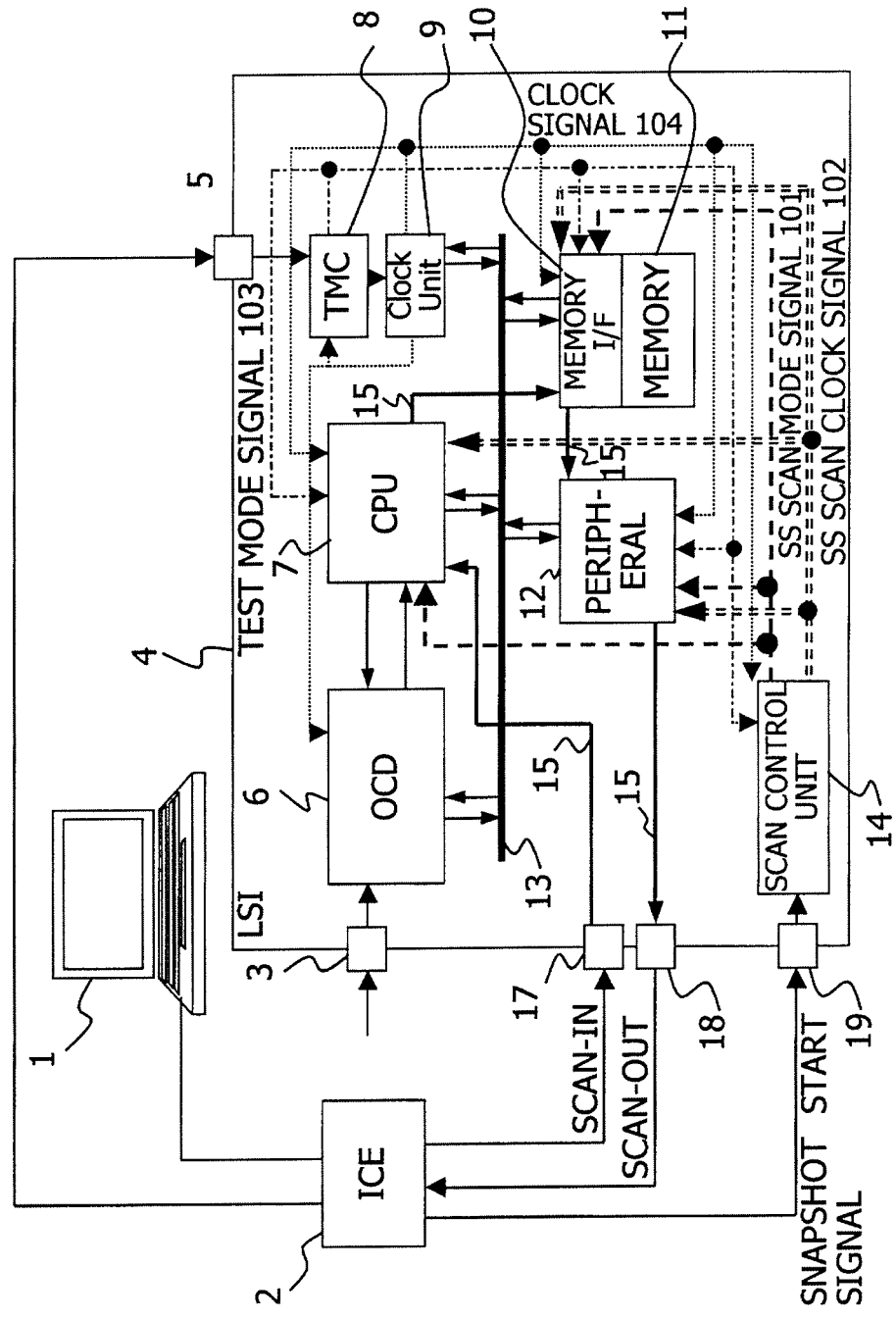
FIG. 3 is a configuration diagram illustrating the LSI according to the first embodiment.

FIG. 3 is a configuration diagram illustrating the LSI according to the first embodiment. In the LSI 4 of FIG. 3, the SS scan chain 16 is removed from the LSI 4 of FIG. 1, and an external terminal 19 is added. As described below, FIG. 3 is different from FIG. 1 in the configuration of the internal circuit of the CPU 7, the peripheral functional circuit 12, and the memory interface 10. In addition, a snapshot start signal is input from the debug tool 1 to the LSI 4 through the ICE 2. Furthermore, the scan control unit 14 outputs an SS scan mode signal 101 and an SS scan clock signal 102 in response to a snapshot start signal input through the external terminal 19.

FIG. 4 is a diagram illustrating a configuration of the internal circuit according to the first embodiment. FIG. 4 illustrates a part of the internal circuit 30 in the CPU 7, the memory interface 10, and the peripheral functional circuit 12 of the LSI 4 of FIG. 3.

The internal circuit 50 of FIG. 4 includes combinational circuits 51 and 56 and main FFs 53 and 58. In a normal operation, the main FF 53 latches the output signal of the combinational circuits 51 in synchronization with a main clock signal 105, and the main FF 58 latches the output signal of the combinational circuit 56 in synchronization with a main clock signal 105, which will be described below.

The internal circuit 50 includes a main scan chain interconnect 15 for connecting main FFs 53 and 58, a switch 52 for selecting any one of the output signal of the combinational circuit 51 and the main scan chain interconnect 15 in response to a snapshot signal 107, and a switch 57 for selecting any one of the output signal of the combinational circuit 56 and the main scan chain interconnect 15 in response to a snapshot signal 107, which will be described below.

In this internal circuit 50, the switches 52 and 57 select a signal of the main scan chain interconnect 15 for troubleshooting. In addition, the data of the main FFs 53 and 58 is output as a scan-out signal from the scan-out terminal 18 through the main scan chain interconnect 15, and is supplied to the debug tool through the ICE 2. However, in this case, since the switches 52 and 57 select a signal of the main scan chain interconnect 15, a normal operation using the combinational circuits 51 and 56 and the main FFs 53 and 58 is interrupted.

In this regard, the internal circuit 50 includes subsidiary FFs 54 and 59, a switch 55 for selecting any one of the latch signal of the main FF 53 and the latch signal of the subsidiary FF 54 in response to a flip-flop selection signal 108, a switch 60 for selecting any one of the latch signal of the main FF 58 and the latch signal of the subsidiary FF 59 in response to a flip-flop selection signal 108, and a mode control circuit 61 for controlling an operation of the internal circuit 50 during the normal operation and the scan test.

The mode control circuit 61 receives the SS scan mode signal 101, the SS scan clock signal 102, the test mode signal 103, and the clock signal 104 and outputs the main clock signal 105, the sub-clock signal 106, the snapshot signal 107, and the flip-flop selection signal 108.

As a result, in the normal operation, the switch 52 selects the output signal of the combinational circuits 51 (switch "0" side) based on the snapshot signal 107, and the switch 57 selects the output signal of the combinational circuits 56 (switch "0" side) based on the snapshot signal 107. The switch 55 selects the latch signal of the main FFs 53 (switch "0" side) based on the flip-flop selection signal 108, and the switch 60 selects the latch signal of the main FFs 53 and 58 (switch "0" side) based on the flip-flop selection signal 108. The main FF 53 latches the output signal of the combinational circuits 51 in synchronization with the main clock signal 105, and the main FF 58 latches the output signal of the combinational circuits 56 in synchronization with the main clock signal 105. At the same time, the latch signals of the main FFs 53 and 58 are input to the combinational circuit in the following stage respectively.

In a scan test, the switches 52 and 57 select a signal of the main scan chain interconnect 15 (switch "1" side) based on the snapshot signal 107, and the switch 55 selects the latch signal of the subsidiary FF 54 (switch "1" side) based on the flip-flop selection signal 108, and the switch 60 selects the latch signal of the subsidiary FF 59 (switch "1" side) based on the flip-flop selection signal 108. As a result, the subsidiary FF 54 latches the output signal of the combinational circuit 51 in synchronization with the sub-clock signal 106, and the subsidiary FF 59 latches the output signal of the combinational circuit 56 in synchronization with the sub-clock signal 106. At the same time, the latch signals of the subsidiary FFs 54 and 59 are input to the combinational circuit of the following stage respectively. In addition, the main FF 58 latches a latch signal of the main FF 53 in synchronization with the main clock signal 105, and the main FF 53 latches a latch signal of the main FF of the preceding stage (not illustrated) in synchronization with the main clock signal 105.

As a result, in overall main FFs connected using the main scan chain interconnect 15, the latch signal of the main FF of the preceding stage is sequentially latched on the main FF of the following stage, so that data indicating an internal state of the LSI at the timing of the snapshot signal 107 is output from the scan-out terminal 18 through the main scan chain interconnect 15 and is supplied to the debug tool 1. In addition, while the latch signal of the main FF is scanned out through the main scan chain interconnect 15, the switch 55 selects the latch signal of the subsidiary FF 54 and the switch 60 selects the latch signal of the subsidiary FF 59. Therefore, the internal circuit 50 can continuously perform a normal operation using the combinational circuits 51 and 56 and the subsidiary FFs 54 and 59.

As described above, in FIG. 4, the latch signals of the main FFs 53 and 54 indicating an internal state of the LSI at the timing of the snapshot signal 107 is read through the main scan chain interconnect 15. Therefore, an interconnect corresponding to the SS scan chain interconnect 16 of FIGS. 1 and 2 may be removed. In addition, in FIG. 2, there is a risk that the read data of the subsidiary FF is not correct as described above. However, since it is verified that the main FFs 53 and 58 are properly operated in a normal operation, and the data is read using the main FF in FIG. 4, such a risk is not generated.

According to the first embodiment, the operation of the internal circuit 50 is divided into four operation modes (idle mode, snapshot mode, scan-out mode, return mode). FIGS. 5A and 5B are diagrams illustrating operation modes according to the first embodiment. FIG. 5A illustrates the SS scan mode signal 101, switching conditions for the operation modes, and operation modes after switching. FIG. 5B illustrates the output signal of the mode control circuit 61.

In the idle mode, the internal circuit 50 performs a normal operation using the combinational circuits 51 and 56 and the main FFs 53 and 58. That is, in this operation mode, as described above, the switch 52 selects the output signal of the combinational circuit 51 (switch "0" side) based on the snapshot signal 107, the switch 57 selects the output signal of the combinational circuit 56 (switch "0" side) based on the snapshot signal 107, the switch 55 selects the latch signal of the main FF 53 (switch "0" side) based on the flip-flop selection signal, and the switch 60 selects the latch signal of the main FF 58 (switch "0" side) based on the flip-flop selection signal.

As illustrated in FIG. 5A, in the idle mode IDLE, two bits of the SS scan mode signal 101 corresponds to "00." In addition, as illustrated in FIG. 5B, in the idle mode IDLE, the mode control circuit 61 outputs the received clock signal 104 as the main clock signal 105, and the received test mode signal 103 as the snapshot signal 107, respectively. In addition, the mode control circuit 61 sets the output sub-clock signal 106 and the flip-flop selection signal 108 to a low level L. That is, in the idle mode IDLE, the subsidiary FF 54 receiving the sub-clock signal 106 do not latch the output signal of the combinational circuit 51, and the subsidiary FF 59 receiving the sub-clock signal 106 do not latch the output signal of the combinational circuits 56. In addition, the switch 55 receiving the flip-flop selection signal 108 selects the latch signal of the main FF 53 (switch "0" side), and the switch 60 receiving the flip-flop selection signal 108 selects the latch signal of the main FF 58 (switch "0" side).

Returning to FIG. 5A, in the idle mode IDLE, the internal circuit 50 continuously performs the operation of the idle mode IDLE while the snapshot start signal has a low level L. However, as the snapshot signal has a high level H at an arbitrary timing, the scan control unit 14 causes the SS scan mode signal 101 to switch from "00" to "10" and causes the operation mode to switch to the snapshot mode SS.

The snapshot mode SS refers to a transitional operation of the internal circuit 50 after the snapshot start signal having a high level H is input during the idle mode so that the SS scan mode signal 101 switches from "00" to "10" until the operation of the scan-out mode SOUT starts as described below.

As illustrated in FIG. 5A, in the snapshot mode SS, an operation mode switches to the scan-out mode SOUT after a single clock of the clock signal 104 elapses. That is, the scan control unit 14 causes the SS scan mode signal 101 to switch from "10" to "11." In addition, as illustrated in FIG. 5B, in the snapshot mode SS, the mode control circuit 61 sets the snapshot signal 107 to a high level H, and the signals 105, 106, and 108 are retained as in the idle mode. As a result, the switches 52 and 57 receiving the snapshot signal 107 select a signal of the main scan chain interconnect 15 (switch "1" side).

In the scan-out mode SOUT, the internal circuit 50 performs a normal operation using the combinational circuits 51 and 56 and the subsidiary FFs 54 and 59. That is, in this operation mode, as described above, the switches 52 and 57 select a signal of the main scan chain interconnect 15 (switch "1" side) based on the snapshot signal 107 having a high level H, the switch 55 selects the latch signal of the subsidiary FF 54 (switch "1" side) based on the flip-flop selection signal having a high level H, and the switch 60 selects the latch signal of the subsidiary FF 59 (switch "1" side) based on the flip-flop selection signal having a high level H.

As illustrated in FIG. 5A, in the scan-out mode SOUT, the internal circuit 50 continuously performs the operation of the scan-out mode SOUT while the test mode signal 103 has a high level H.

Meanwhile, as the test mode signal 103 has a low level L at an arbitrary timing, an operation mode switches to the return mode. That is, the scan control unit 14 causes the SS scan mode signal 101 to switch from "11" to "01."

In the scan-out mode SOUT, as illustrated in FIG. 5B, the mode control circuit 61 outputs the received SS scan clock signal 102 as the main clock signal 105, and the received clock signal 104 as the sub-clock signal 106, respectively. The output snapshot signal 107 and the output flip-flop selection signal 108 are set to a high level H. As a result, the switch 55 receiving the flip-flop selection signal 108 selects the latch signal of the subsidiary FF 54 (switch "1" side), and the switch 60 receiving the flip-flop selection signal 108 selects the latch signal of the subsidiary FF 59 (switch "1" side). That is, in the scan-out mode SOUT, the internal circuit 50 continuously performs a normal operation using the combinational circuits 51 and 56 and the subsidiary FFs 54 and 59. And the latch signals of the main FFs 53 and 58 are scanned out and read through the main scan chain interconnect 15.

The return mode RET refers to a transitional operation of the internal circuit 50 after the SS scan mode signal 101 switches from "11" to 01" until the operation of the idle mode IDLE starts as described above.

As illustrated in FIG. 5A, in the return mode RET, an operation mode switches to the idle mode IDLE after a single clock of the clock signal 104 elapses. That is, the scan control unit 14 causes the SS scan mode signal 101 to switch from "01" to "00." In addition, the mode control circuit sets the snapshot signal 107 to a low level L, and the signals 105, 106, and 108 are continuously in the scan-out mode state.

In this manner, the operation mode of the internal circuit 50 sequentially switches to the idle mode, the snapshot mode, the scan-out mode, and the return mode when the switching condition of FIG. 5A is satisfied.

Figure 6:
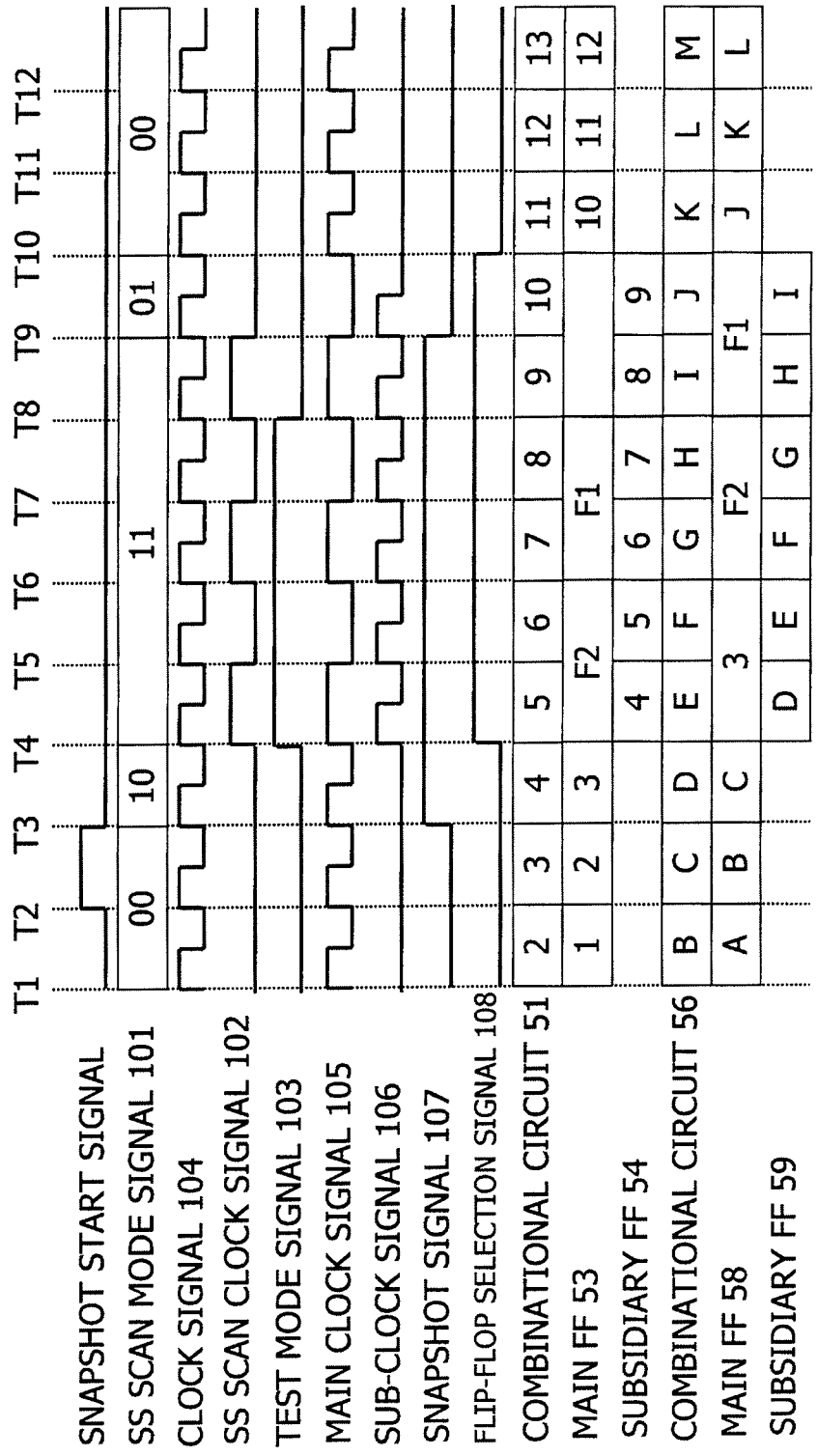
FIG. 6 is a waveform diagram illustrating a signal output from the mode control circuit according to the first embodiment.

Specific operations of the internal circuit 50 in the four operation modes described above will be described with reference to FIGS. 6, 7A, 7B, 8A, 8B, 9A, 9B, 10A and 10B. FIG. 6 is a waveform diagram illustrating a signal output from the mode control circuit according to the first embodiment. In the internal circuit 50, it is assumed that a single main FF (hereinafter, referred to as a preceding main FF), which is not illustrated, and a subsidiary FF (hereinafter, referred to as a preceding subsidiary FF) corresponding to the preceding main FF are arranged in the preceding stage of the main FF 53, and another single main FF (hereinafter, referred to as a second preceding main FF) and another subsidiary FF (hereinafter, referred to as a second preceding subsidiary FF) corresponding to the second preceding main FF are arranged in the stage before the preceding stage, so that these four main FFs are connected to the main scan chain interconnect 15.

[Idle Mode (Time T1 to T2)]

At time T1, the SS scan mode signal 101 is set to "00," and the operation mode of the internal circuit 50 is set to the idle mode IDLE.

Figure 7B:
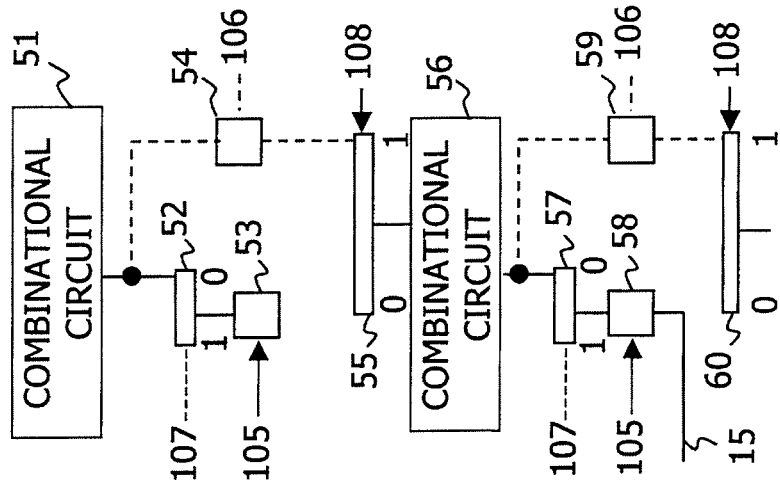
FIGS. 7A and 7B are diagrams illustrating operational states of the idle mode according to the first embodiment.
Figure 7A:
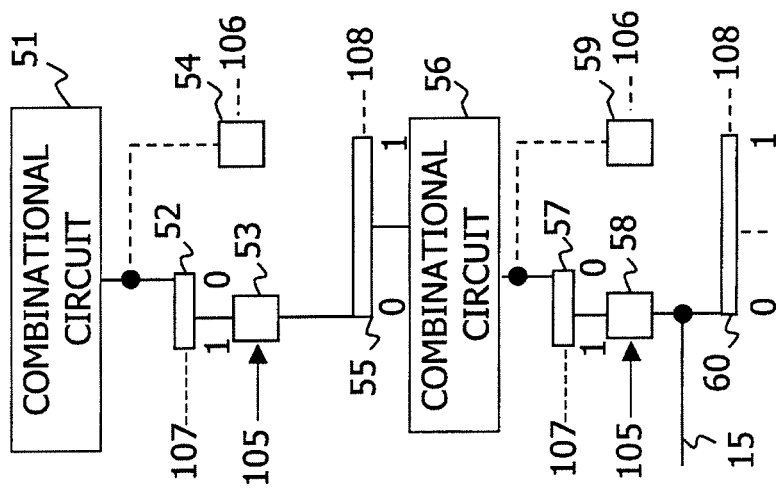

FIGS. 7A and 7B are diagrams illustrating operational states of the idle mode according to the first embodiment. In the idle mode, the mode control circuit 61 outputs the clock signal 104 as a main clock signal 105, and sets the sub-clock signal 106, the snapshot signal 107, and the flip-flop selection signal 108 to a low level L.

As indicated by the solid line of FIG. 7A, the switch 52 selects the output signal of the combinational circuit 51 (switch "0" side) based on the snapshot signal 107 having a low level L, the switch 57 selects the output signal of the combinational circuit 56 (switch "0" side) based on the snapshot signal 107 having a low level L, the switch 55 selects the latch signal of the main FF 53 based on the flip-flop selection signal 108 having a low level L, and the switch 60 selects the latch signal of the main FF 58 based on the flip-flop selection signal 108 having a low level L.

As a result, the main FF 53 latches the output signal "1" of the combinational circuit 51 before a single clock from time T1 in response to a rising edge of the main clock signal 105, and the main FF 58 latches the output signals "A" of the combinational circuit 56 before a single clock from time T1 in response to a rising edge of the main clock signal 105. Such latch signals are also input to the combinational circuit in the following stage. In addition, the combinational circuit 51 receives the latch signal of the preceding main FF and outputs the output signal "2" using an internal logic circuit, and the combinational circuit 56 receives the latch signal of the main FF 53 and outputs the output signal "B" using an internal logic circuit. The output signal "2" of the combinational circuit 51 is sent to the input terminal of the main FF 53 through the switch 52, and the output signal "B" of the combinational circuit 56 is sent to the input terminal of the main FF 58 through the switch 57.

In this manner, at time T1, the internal circuit 50 performs an normal operation using the combinational circuits 51 and 56 and the main FFs 53 and 58.

At time T2, in order to read an internal state of the LSI 4, the snapshot start signal having a high level H is input to the LSI 4 only for a single period of the clock signal 104. Furthermore, similar to time T1, the internal circuit 50 performs the normal operation. The output signal "3" of the combinational circuit 51 is sent to the input terminal of the main FF 53 through the switch 52, and the output signal "C" of the combinational circuit 56 is sent to the input terminal of the main FF 58 through the switch 57.

[Snapshot Mode (Time T3)]

At time T3, the scan control unit 14 causes the SS scan mode signal 101 to switch from "00" to "10" in response to the snapshot start signal having a high level H and causes an operation mode of the internal circuit 50 from the idle mode to the snapshot mode.

Figure 8A:
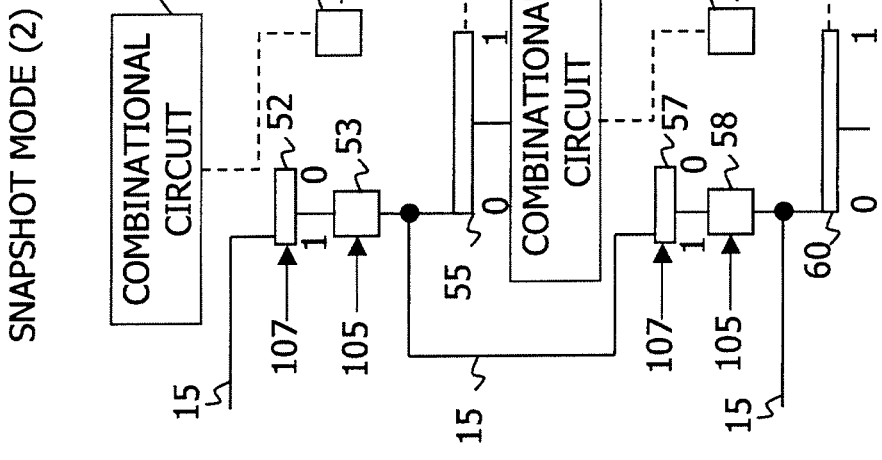
FIGS. 8A and 8B are diagrams illustrating operational states of the snapshot mode according to the first embodiment.
Figure 8B:
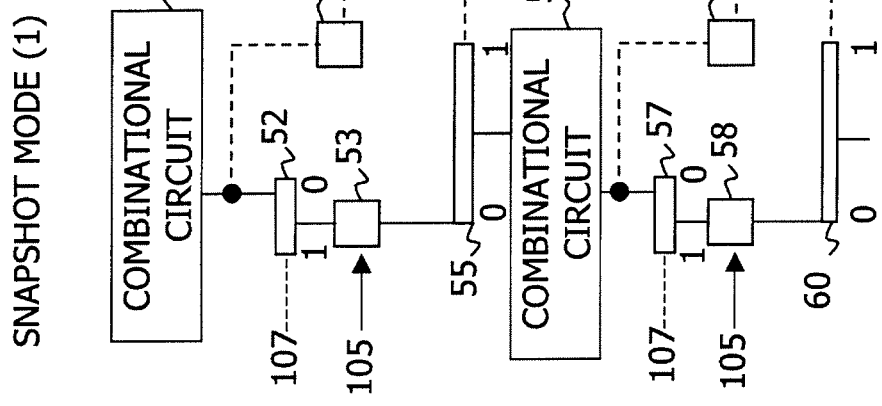

FIGS. 8A and 8B are diagrams illustrating operational states of the snapshot mode according to the first embodiment. In the snapshot mode, the mode control circuit 61 outputs the clock signal 104 as a main clock signal 105 and sets the snapshot signal 107 to a high level H. In addition, the mode control circuit 61 retains the sub-clock signal 106 and the flip-flop selection signal 108 at a low level L.

As a result, as indicated by the solid line of FIG. 8A, the main FF 53 latches the output signal "3" of the combinational circuit 51 at time T2 in response to a rising edge of the main clock signal 105, and the main FF 58 latches the output signal "C" of the combinational circuit 56 at time T2 in response to a rising edge of the main clock signal 105. Since the switches 55 and 60 select the "0" side, such signals are also input to the combinational circuit in the following stage. In addition, the combinational circuit 51 receives the latch signal of the preceding main FF and outputs the output signal "4." And the combinational circuit 56 receives the latch signal of the main FF 53 and outputs the output signal "D." The output signal "4" is sent to the input terminal of the subsidiary FF 54, and the output signal "D" is sent to the input terminal of the subsidiary FF 59. At the same time, as indicated by the solid line of FIG. 8B, the switches 52 and 57 switch to a signal of the main scan chain interconnect 15 (switch "1" side) based on the snapshot signal 107 having a high level H.

In this manner, as an operation mode switches from the idle mode to the snapshot mode, switching of the switches 52 and 57 are performed after latching of the main FFs 53 and 58. As a result, the latch signal of the main FF 53 is input to the combinational circuit 56 through the switch 55, and the latch signal of the main FF 58 is input to the combinational circuit in the following stage through the switch 60. The combinational circuit 51 receives the latch signal of the preceding main FF, and outputs the output signal "4." The combinational circuit 56 receives the latch signal of the main FF 53, and outputs the output signal "0."

[Scan-Out Mode (Time T4 to T8)]

At time T4 after a single clock of the clock signal 104 elapses from time T3, an operation mode of the internal circuit 50 switches from the snapshot mode to the scan-out mode. That is, the scan control unit 14 causes the SS scan mode signal 101 to switch from "10" to 11."

At time T4, the scan control unit 14 generates three periods of the SS sub-clock signal 102 having a period which is twice that of the clock signal 104. In addition, for four periods of the clock signal 104 from time T4, the test mode signal 103 having a high level H is output from the test mode controller 8.

FIGS. 9A and 9B are diagrams illustrating operational states of the scan-out mode according to the first embodiment. In the scan-out mode, the mode control circuit 61 outputs the SS scan clock signal 102 as a main clock signal 105 and outputs the clock signal 104 as a sub-clock signal 106. In addition, the mode control circuit 61 sets the output snapshot signal 107 and the flip-flop selection signal 108 to a high level H.

As a result, as indicated by the solid line of FIG. 9A, the subsidiary FF 54 latches the output signal "4" of the combinational circuit 51 at time T3 in synchronization with the sub-clock signal 106, and the subsidiary FF 59 latches the output signal "D" of the combinational circuit 56 at time T3 in synchronization with the sub-clock signal 106. At the same time, as indicated by the solid line of FIG. 9B, the switch 55 switches to the latch signal of the subsidiary FF 54 (switch "1" side) based on the flip-flop selection signal 108 having a high level H, and the switch 60 switches to the latch signal of the subsidiary FF 59 (switch "1" side) based on the flip-flop selection signal 108 having a high level H. As a result, the latch signal "4" of the subsidiary FF 54 is input to the combinational circuit 56 and the latch signal "0" of the subsidiary FF 59 is input to the combinational circuit in the following stage. In addition, the combinational circuit 51 receives the latch signal of the preceding subsidiary FF and outputs the output signal "5." The combinational circuit 56 receives the latch signal of the subsidiary FF 54 and outputs the output signal "E." The output signal "5" is sent to the input terminal of the subsidiary FF 54, and the output signal "E" is sent to the input terminal of the subsidiary FF 59.

In this manner, as an operation mode switches from the snapshot mode to the scan-out mode, switching of the switches 55 and 60 is performed after latching of the subsidiary FFs 54 and 59. As a result, the latch signal of the subsidiary FF 54 is input to the combinational circuit 56, and the latch signal of the subsidiary FF 59 is input to the combinational circuit in the following stage. And, the combinational circuit 51 receives the latch signal of the preceding subsidiary FF, and outputs the output signal "5." the combinational circuit 56 receives the latch signal of the subsidiary FF 54 and outputs the output signal "E."

Meanwhile, as illustrated in FIGS. 9A and 9B, the switches 52 and 57 select a signal of the main scan chain interconnect 15 (switch "1" side) based on the snapshot signal 107 having a high level H. As a result, the main FF 53 latches the latch signal "F2" of the preceding main FF through the main scan chain interconnect 15 at time T3 in synchronization with the main clock signal 105. In addition, the main FF 58 latches the latch signal "3" of the main FF 53 through the main scan chain interconnect 15 at time T3 in synchronization with the main clock signal 105. Furthermore, the latch signal "C" of the main FF 58 is output from the scan-out terminal 18 at time T3. That is, the data reading from the main FF through the main scan chain terminal 15 starts from time T4.

At time T5, as illustrated in FIG. 9B, the subsidiary FF 54 latches the output signal "5" of the combinational circuit 51 at time T4 in response to a rising edge of the sub-clock signal 106, and the subsidiary FF 59 latches the output signal "E" of the combinational circuit 56 at time T4 in response to a rising edge of the sub-clock signal 106. Such latch signals are input to the combinational circuit in the following stage. In addition, the combinational circuit 51 receives the latch signal of the preceding subsidiary FF and outputs the output signal "6." and the combinational circuit 56 receives the latch signal of the subsidiary FF 54 and outputs the output signal "F." The output signal "6" is sent to the input terminal of the subsidiary FF 54, and the output signal "F" is sent to the input terminal of the subsidiary FF 59.

At time T6 to T8, the internal circuit 50 continuously performs the normal operation using the combinational circuits 51 and 56 and the subsidiary FFs 54 and 59. In addition, at time T6 and T8, each main FF latches the latch signal of the preceding main FF in response to the rising edge of the main clock signal, so that data is read from the main FF through the main scan chain interconnect 15.

[Return Mode (Time T9)]

At time T9, the scan control unit 14 causes the SS scan mode signal 101 to switch from "11" to "01" in response to a falling edge of the test mode signal 103 at time T8. That is, the operation mode of the internal circuit 50 switches from the scan-out mode to the return mode.

FIGS. 10A and 10B are diagrams illustrating operational states of the return mode according to the first embodiment. In the return mode, the mode control circuit 61 outputs the SS scan clock signal 102 as a main clock signal 105 and outputs the clock signal 104 as a sub-clock signal 106. In addition, the mode control circuit 61 sets the snapshot signal 107 to a low level L and retains the flip-flop selection signal at a high level H.

As a result, as indicated by the solid line of FIG. 10A, the subsidiary FF 54 latches the output signal "9" of the combinational circuit 51 at time T8 in response to a rising edge of the sub-clock signal 106 at time T9, and the subsidiary FF 59 latches the output signal "I" of the combinational circuit 56 at time T8 in response to a rising edge of the sub-clock signal 106 at time T9. Such latch signals are input to the combinational circuit in the following stage. In addition, the combinational circuit 51 receives the latch signal of the preceding subsidiary FF, and outputs the output signal "10." The combinational circuit 56 receives the latch signal of the subsidiary FF 54, and outputs the output signal "J." The output signal "10" is sent to the input terminal of the subsidiary FF 54, and the output signal "J" is sent to the input terminal of the subsidiary FF 59. At the same time, as illustrated in FIG. 10B, the switch 52 selects the output signal of the combinational circuit 51 (switch "0" side) based on the snapshot signal 107 having a low level L, and the switch 57 selects the output signal of the combinational circuit 56 (switch "0" side) based on the snapshot signal 107 having a low level L.

In this manner, in the return mode, switching of the switches 52 and 57 is performed after latching of the subsidiary FF. As a result, the latch signal "9" of the subsidiary FF 54 is input to the combinational circuit 56, and the latch signal "I" of the subsidiary FF 59 is input to the combinational circuit in the following stage. The combinational circuits 51 receives the preceding subsidiary FF, and outputs the output signal "10." The combinational circuit 56 receives the subsidiary FF 54, and outputs the output signal "3."

[Idle Mode (Time T10 to T12)]

At time T10 after a single clock of the clock signal 104 elapses from time T9, the operation mode switches from the return mode to the idle mode. That is, the scan control unit 14 causes the SS scan mode signal 101 to switch from "01" to "00."

In the idle mode, the mode control circuit 61 outputs the clock signal 104 as a main clock signal 105 and outputs the test mode signal 103 having a low level L as a snapshot signal 107. In addition, the mode control circuit 61 sets the sub-clock signal 106 and the flip-flop selection signal 108 to a low level L.

As a result, as illustrated in FIG. 7B, the main FF 53 latches the output signal "10" of the combinational circuit at time T9, and the main FF 58 latches the output signal "J" of the combinational circuit at time T9. Such latch signals are input to the combinational circuit in the following stage. The combinational circuit 51 receives the latch signal of the preceding main FF and outputs the output signal "11." The combinational circuit 56 receives the latch signal of the main FF 53 and outputs the output signal "K." In addition, the latch signal "F1" of the second preceding main FF at time T3 is output through the main scan chain interconnect 15. As illustrated in FIG. 7A, the switch 55 selects the latch signal of the main FF 53 (switch "0" side) based on the flip-flop selection signal 108 having a low level L, and the switch 60 selects the latch signal of the main FF 58 (switch "0" side) based on the flip-flop selection signal 108 having a low level L. As a result, the output signal "11" of the combinational circuit 51 is sent to the input terminal of the main FF 53, and the output signal "K" of the combinational circuit 56 is sent to the input terminal of the main FF 58.

In this manner, as an operation mode switches from the return mode to the idle mode, switching of the switches 55 and 60 is performed after latching of the main FFs 53 and 58. As a result, the latch signal "10" of the main FF 53 is input to the combinational circuit 56, and the latch signal "J" of the main FF 58 is input to the combinational circuit in the following stage. The combinational circuit 51 receives the latch signal of the preceding main FF and outputs the output signal "11." The combinational circuit 56 receives the latch signal of the main FF 53 and outputs the output signal "K." After time T11, the internal circuit 50 performs the normal operation as in time T1.

The four operation modes described above are repeated whenever an internal state is scanned out at an arbitrary snapshot timing.

As described above, the internal circuit 50 continuously performs the normal operation using the combinational circuits 51 and 56 and the main FFs 53 and 58 in the idle mode and the snapshot mode. In the scan-out mode and the return mode, the internal circuit 50 reads the data indicating an internal state of the LSI from the main FFs 53 and 58 while the normal operation is continuously performed using the combinational circuits 51 and 56 and the subsidiary FFs 54 and 59. As a result, the SS scan chain interconnect 16 of FIGS. 1 and 2 is may be removed, and data can be read from the main FF while the normal operation is continuously performed.

While description in the first embodiment has been made for operations of the internal circuit 50 using a pair of scan units including a scan unit having the combinational circuit 51, the switches 52 and 55, the main FF 53, and the subsidiary FF 54 and a scan unit having the combinational circuit 56, the switches 57 and 60, the main FF 58, and the subsidiary FF 59, three or more scan units may be used. Alternatively, a single scan unit may be used by connecting only one of plural main FFs provided in the internal circuit 50 to the main scan chain interconnect 15 and providing a subsidiary FF corresponding to this main FF.

Although the mode control circuit 61 is provided in each internal circuit 50 of the CPU 7, the peripheral functional circuit 12, and the memory interface 10, the mode control circuit 61 may be solely provided in the LSI 4 to supply signals 105 to 108 to each internal circuit 50.

Second Embodiment

In the first embodiment, the internal circuit 50 performs the normal operation using the main FFs 53 and 56 in the idle mode. However, if the main FF 53 or 58 has a failure, it is difficult for the internal circuit 50 to continuously perform the normal operation. In this regard, according to the second embodiment, the normal operation is continuously performed using the subsidiary FFs 54 and 59 instead of the main FFs 53 and 58 in this case.

Figure 11:
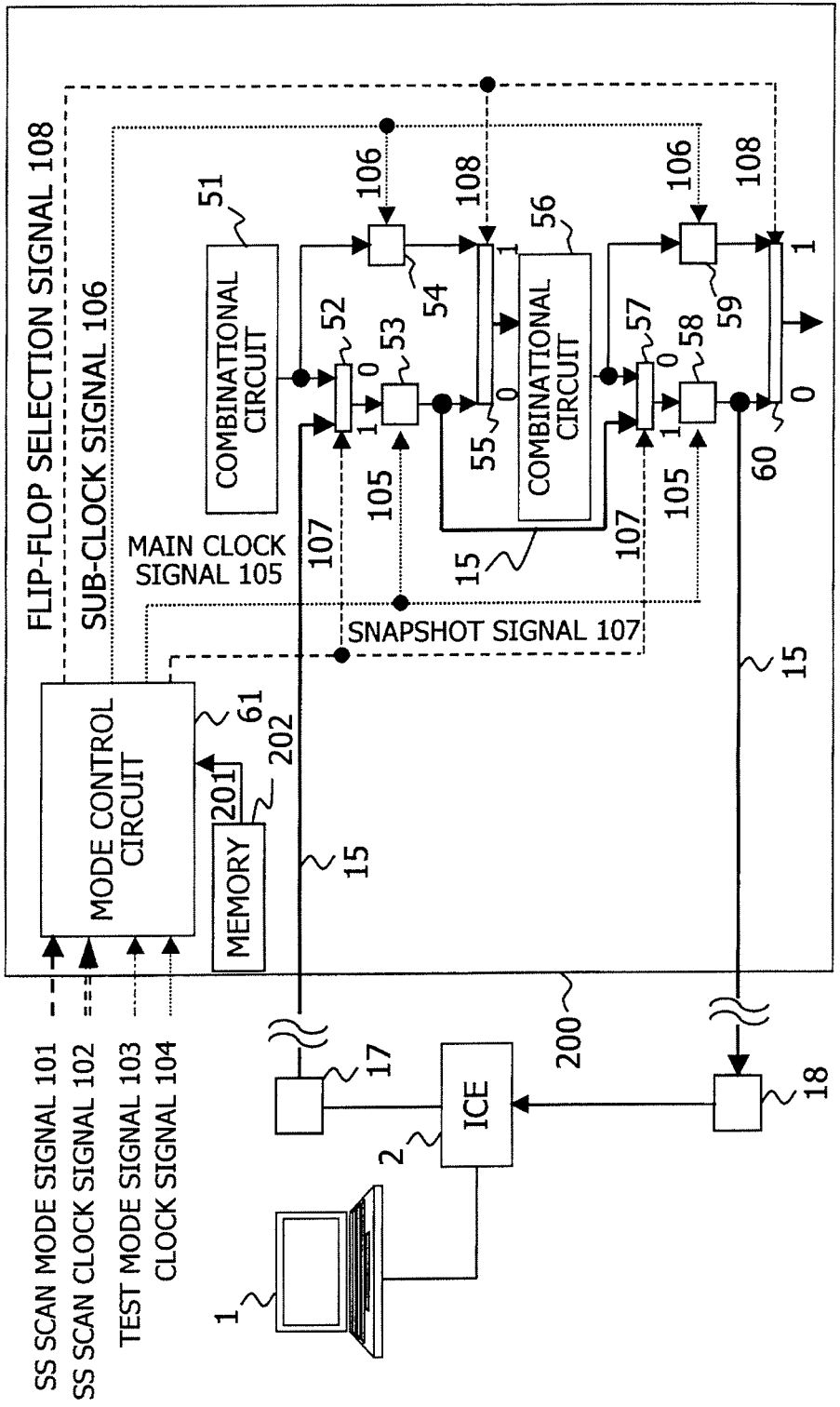
FIG. 11 is a diagram illustrating a configuration of the internal circuit according to the second embodiment.

FIG. 11 is a diagram illustrating a configuration of the internal circuit according to the second embodiment. The configuration of FIG. 11 illustrates a part of an internal circuit 200 of the CPU 7, the memory interface 10, and the peripheral functional circuit 12 included in the LSI 4 of FIG. 3.

The internal circuit 200 has an alternative mode in addition to the four operation modes (idle mode, snapshot mode, scan-out mode, and return mode) of the first embodiment. In addition, when the internal circuit 200 does not perform the normal operation due to a failure of the main FF 53 or 58, the operation mode switches to the alternative mode. While the internal circuit 200 has a configuration similar to that of the internal circuit 50 of FIG. 4 of the first embodiment, the internal circuit 200 further includes a nonvolatile memory 202 for storing whether or not an alternative mode is performed. In addition, as described below, the mode control circuit 61 latches the alternative mode signal 201 from the memory 202 and outputs the sub-clock signal 106 and the flip-flop selection signal 108.

When the internal circuit 200 operates in any one of the four operation modes (idle mode, snapshot mode, scan-out mode, and return mode), the memory 202 has a non-alternative mode state "1." In addition, in a case where a failure of the main FFs 53 or 58 is determined through a test such as debugging, the memory 202 is rewritten by a user to an alternative mode state "0," and the operation mode switches to the alternative mode.

The mode control circuit 61 outputs the sub-clock signal 106 and the flip-flop signal 108 having a high level H in response to the alternative mode signal 201 output from the memory 202 having an alternative mode state "0." As a result, the subsidiary FF 54 latches the output signal of the combinational circuit 51 in synchronization with the sub-clock signal 106, and the subsidiary FF 59 latches the output signal of the combinational circuit 56 in synchronization with the sub-clock signal 106. At the same time, the switch 55 selects the latch signal of the subsidiary FF 54 (switch "1" side), and the switch 60 selects the latch signal of the subsidiary FF 59 (switch "1" side). In addition, the latch signal of the subsidiary FF 54 is input to the combinational circuit 56, and the latch signal of the subsidiary FF 59 is input to the combinational circuit in the following stage. The combinational circuit 51 receives the latch signal of the preceding subsidiary FF, and the combinational circuit 56 receives the latch signal of the subsidiary FF 54. Subsequently, the switch 55 also retains selection of the latch signal of the subsidiary FF 54 (switch "1" side), and the switch 60 also retains selection of the latch signal of the subsidiary FF 59 (switch "1" side). And, the internal circuit 200 continuously performs the normal operation in the alternative mode using the combinational circuits 51 and 56 and the subsidiary FFs 54 and 59.

In this manner, even when the main FF 53 or 58 has a failure in the normal operation, the internal circuit 200 can continuously perform the normal operation using the combinational circuits 51 and 56 and the subsidiary FFs 54 and 59 by switching the switches 55 and 60 from the latch signals of the main FFs 53 and 58 to the latch signals of the subsidiary FFs 54 and 59 in response to the flip-flop selection signal 108. That is, the subsidiary FFs 54 and 59 can be used a substitute for the main FFs 53 and 58. Therefore, the subsidiary FFs 54 and 59 can be used in the normal operation during the scan-out and also can be used as a substitutable unit for the main FFs 53 and 58 when the main FF 53 or 58 has a failure. For this reason, providing the internal circuit 200 with the subsidiary FFs 54 and 59 does not increase cost.

Third Embodiment

In the scan-out mode or the alternative mode described above, the internal circuits 50 and 200 continuously perform the normal operation using the subsidiary FFs 54 and 59. However, if the subsidiary FF 54 or 59 has a failure, it is difficult for the internal circuits 50 and 200 to perform the normal operation. In this regard, according to the third embodiment, a scan test for the subsidiary FFs 54 and 59 is performed using the scan chain interconnect for the subsidiary FFs 54 and 59 described below before the normal operation of the internal circuits 50 and 200 (hereinafter, referred to as scan test mode).

Figure 12:
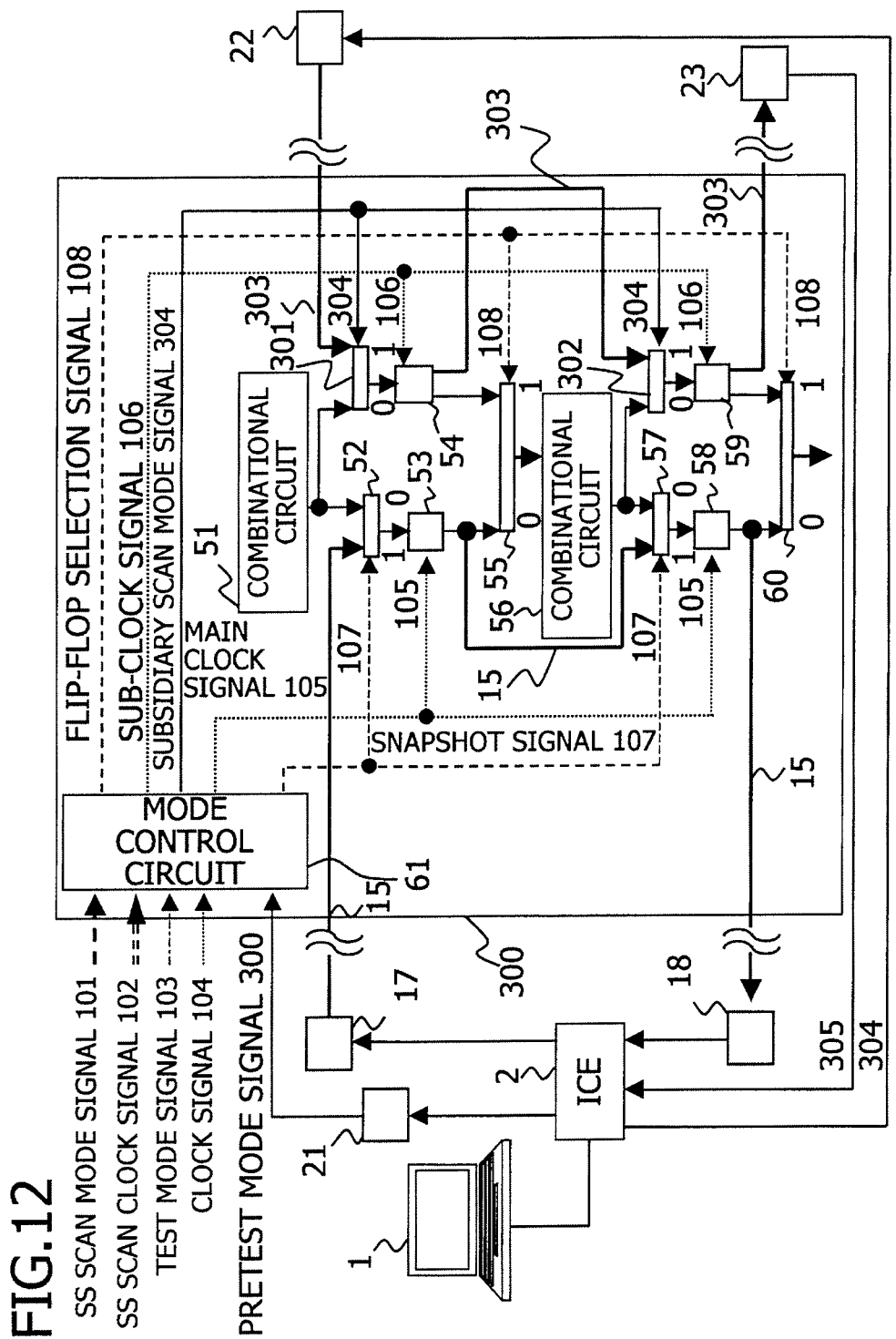
FIG. 12 is a diagram illustrating a configuration of the internal circuit according to the third embodiment.

FIG. 12 is a diagram illustrating a configuration of the internal circuit according to the third embodiment. FIG. 12 illustrates a part of an internal circuit 300 of the CPU 7, the memory interface 10, and the peripheral functional circuit 12 included in the LSI 4 of FIG. 3.

The internal circuit 300 further includes switches 301 and 302 and a subsidiary scan chain interconnect 303, which is a scan chain interconnect for the subsidiary FFs 54 and 59, in addition to the internal circuit 50 of FIG. 4 or the internal circuit 200 of FIG. 11.

Similar to the SS scan chain interconnect 16 of FIG. 1, the subsidiary scan chain interconnect 303 interconnects subsidiary FFs in the LSI 4. In addition, the subsidiary scan chain interconnect 303 receives a subsidiary scan-in signal 304, which is a scan test input signal, through an external terminal 21 from the debug tool 1 and outputs a subsidiary scan-out signal 305, which is data of the subsidiary FFs 54 and 59, through an external terminal 22.

The switch 301 selects any one of the output signal of the combinational circuit 51 and the signal of the subsidiary scan chain interconnect 303 based on a subsidiary scan mode signal 304 described below. The switch 302 also selects any one of the output signal of the combinational circuit 56 and the signal of the subsidiary scan chain interconnect 303 based on a subsidiary scan mode signal 304 described below.

In the scan test mode, first, a pretest mode signal 300 is input to the mode control circuit 61 from the debug tool 1, and a subsidiary scan-in signal 304 is input to the subsidiary scan chain interconnect 303 from the debug tool 1. The mode control circuit 61 outputs the sub-clock signal 106 and the subsidiary scan mode signal 304 having a high level H in response to the pretest mode signal 300. In addition, the switches 301 and 302 select a signal of the subsidiary scan chain interconnect 303 (switch "1" side) based on the subsidiary scan mode signal 304 having a high level H.

As a result, the subsidiary FF 54 latches the subsidiary scan-in signal 304 in response to a rising edge of the sub-clock signal 106. In addition, the subsidiary FF 59 latches the latch signal of the subsidiary FF 54 in response to the next rising edge of the sub-clock signal 106, and the subsidiary FF 54 latches the subsidiary scan-in signal 304 again at the same time. In this manner, the subsidiary FFs 54 and 59 latch the subsidiary scan-in signal 304 in synchronization with the sub-clock signal and input data is sequentially set in the subsidiary FFs 54 and 59. Meanwhile, a scan-out signal 305, which is data of the subsidiary FFs 54 and 59, is output from the external terminal 23 in synchronization with the sub-clock signal. In addition, if the input subsidiary scan-in signal 304 is identical to the output subsidiary scan-in signal 305, it can be determined that the subsidiary FFs 54 and 59 have no failure.

If it can be confirmed that the subsidiary FFs 54 and 59 have no failure through the scan test mode, the internal circuit 300 can continuously perform the normal operation using the main FFs 53 and 58 or the subsidiary FFs 54 and 59 in each operation mode as in the first and second embodiments.

Fourth Embodiment

In a case where the internal circuits 50, 200, and 300 are a memory interface 10, and the combinational circuit 51 or 56 is a memory 11 such as a random access memory (RAM) in the first, second, and third embodiments, it is possible to scan out the data read from the memory and latched on the main FF during the normal operation of the memory interface 10, that is, a read operation of the memory 11 using the LSI 4. However, it is difficult to determine whether or not the scan-out data of the memory corresponds to a desired address because it is difficult to recognize which timing a data read operation for a desired address is performed during the read operation of the memory 11 using the LSI 4, and a timing for switching to the scan-out mode is not known in the first, second, and third embodiments. That is, in the first, second, and third embodiments, although the data read from the memory during the read operation of the memory 11 using the LSI 4 can be scanned out, it is difficult to scan out the data for a desired address.

In this regard, in the fourth embodiment, description will be made for a memory interface 10 capable of reading and scanning out data for a desired address from a memory during the read operation of the memory 11 using the LSI 4.

According to the fourth embodiment, the LSI 4 has a configuration of FIG. 13 described below. While performing the read operation to the memory 11, as described below, the LSI 4 switches from the idle mode to the scan-out mode at a timing in which a desired address is accessed in an internal operation and scans out data for a desired address. As a result, the LSI 4 can scan out data for a desired address while reading of the memory 11 is continuously performed.

According to the fourth embodiment, the memory interface 10 includes a main address FF, a subsidiary address FF, a main data FF, and a subsidiary data FF as described below in conjunction with FIG. 14. The main address FF and the main data FF are included in a scan chain.

Similar to the first to third embodiments, the memory interface 10 performs an normal operation using the main address FF and the main data FF in the idle mode. In the scan-out mode, the memory interface 10 scans out data of the main address FF and data of the main data FF while the normal operation is continuously performed using the subsidiary address FF and the subsidiary data FF.

The fourth embodiment is different from the first to third embodiments in that, in order to switch the operation of the memory interface 10 from the idle mode to the scan-out mode at a timing that the main data FF latches data for a desired address, a set mode is provided, in which the subsidiary address FF previously latches a desired address (hereinafter, referred to as a monitoring address signal) before this switching operation.

If the main address FF latches an address signal identical to the monitoring address signal in the idle mode, a switching operation from the idle mode to the scan-out mode is performed. As a result, the data of the memory corresponding to the monitoring address signal latched on the main address FF is scanned out in the scan-out mode. Consequently, the LSI 4 can scan out data for a desired address while the reading operation of the memory 11 is continuously performed.

Hereinafter, the fourth embodiment will be described in detail.

Figure 13:
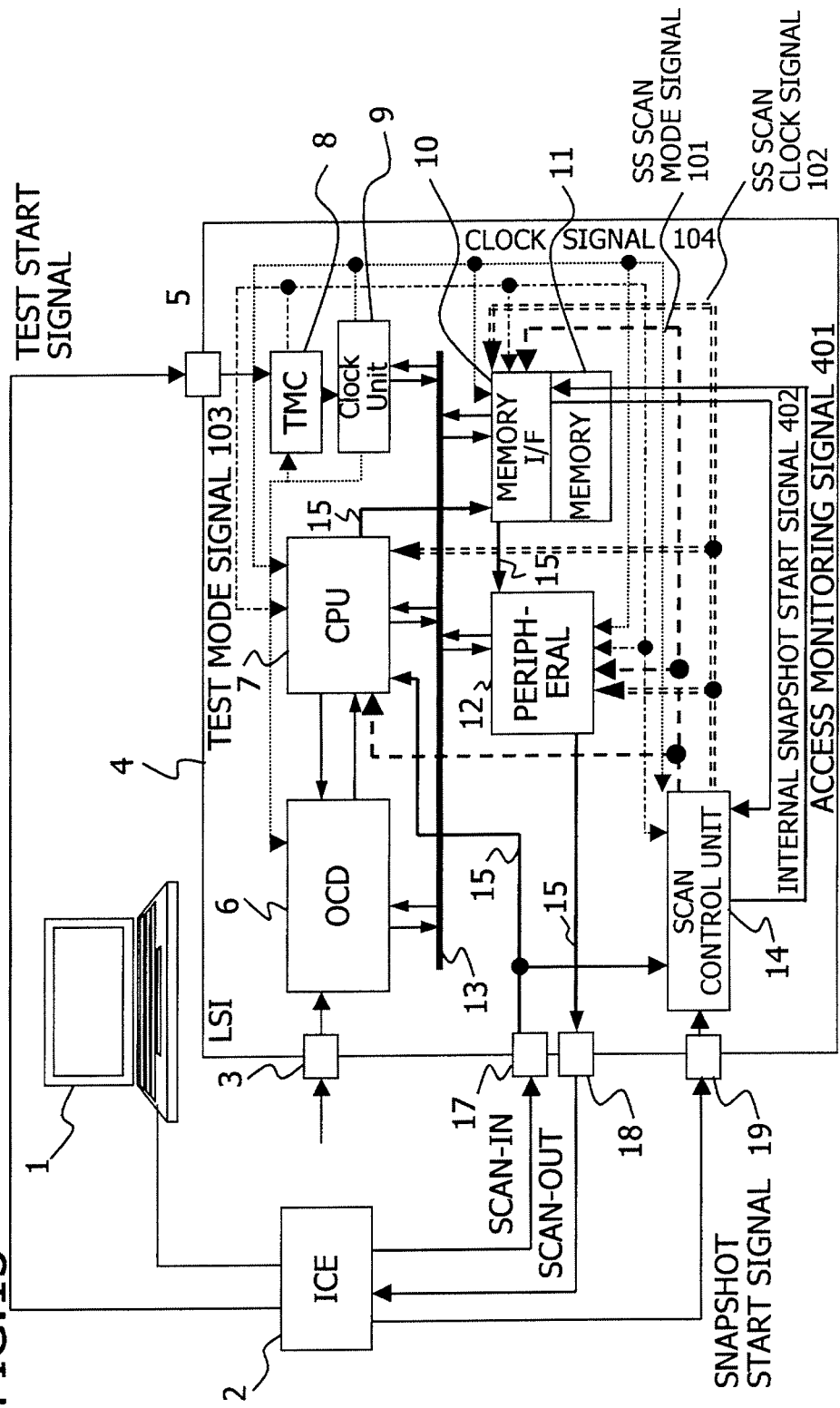
FIG. 13 is a configuration diagram of the LSI according to the fourth embodiment.

FIG. 13 is a configuration diagram of the LSI according to the fourth embodiment. The LSI 4 of FIG. 13 has the same configuration as that of the LSI 4 of FIG. 3. In FIG. 13, like reference numerals denote like elements as in the LSI 4 of FIG. 3.

In FIG. 13, the scan control unit 14 causes the scan-in signal to be input through the scan-in terminal 17. The scan control unit 14 performs switching from the idle mode to the set mode or switching from the set mode to the idle mode based on the scan-in signal and the snapshot start signal as described below. In addition, the scan control unit 14 outputs an access monitoring signal 401 to the memory interface 10 when switching from the set mode to the idle mode is performed. Furthermore, the scan control unit 14 receives an internal snapshot start signal 402 output from the memory interface 10 and starts switching from the idle mode to the scan-out mode based on the internal snapshot start signal 402 as described below.

Figure 14:
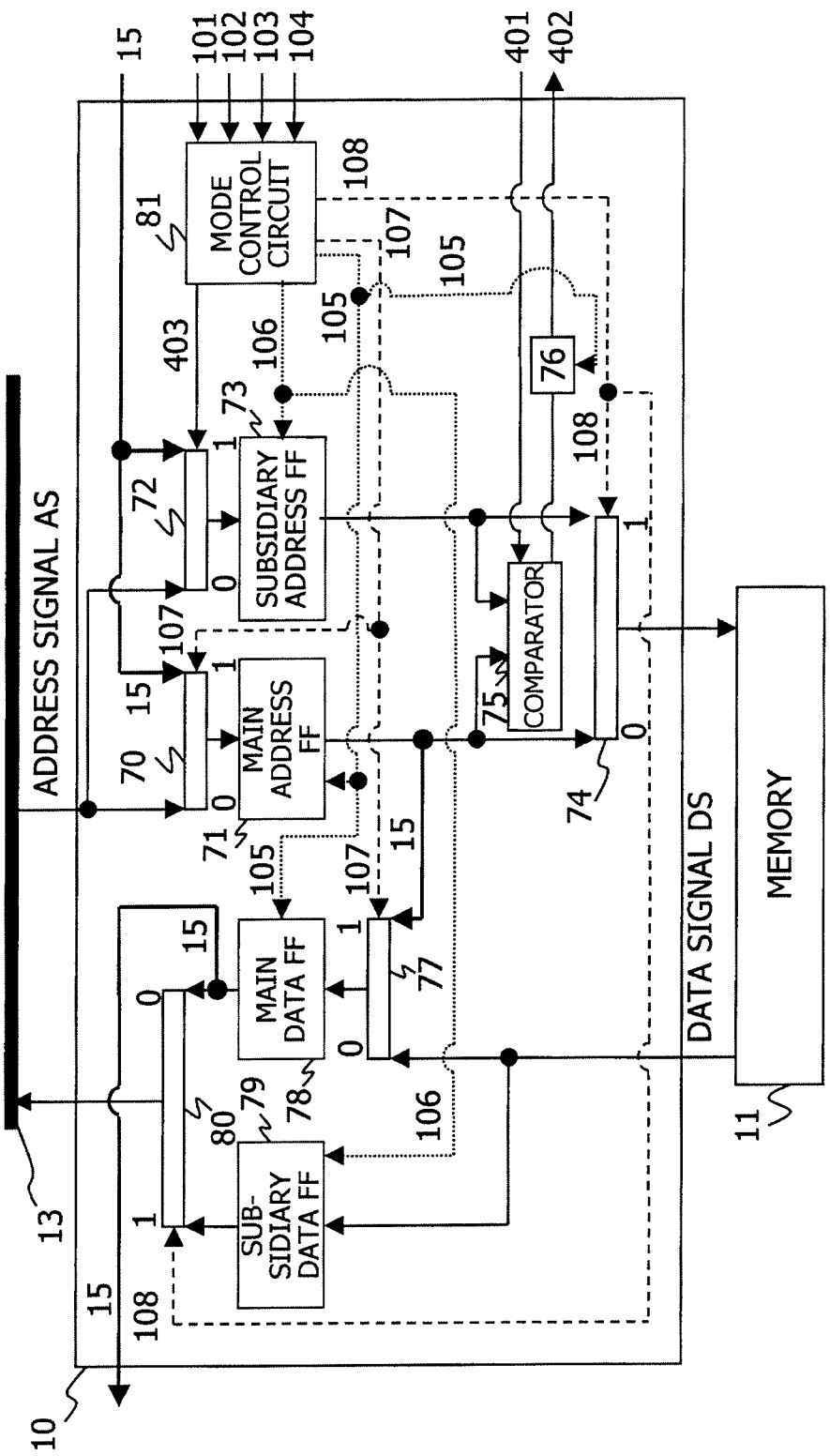
FIG. 14 is a diagram illustrating a configuration of the memory interface according to the fourth embodiment.

FIG. 14 is a diagram illustrating a configuration of the memory interface according to the fourth embodiment.

A mode control circuit 81 performs control for operations of each mode (idle mode, snapshot mode, scan-out mode, return mode, and set mode) of the memory interface 10. Similar to the first to third embodiments, the mode control circuit 81 receives the SS scan mode signal 101, the SS scan clock signal 102, the test mode signal 103, and the clock signal 104 and outputs the main clock signal 105, the sub-clock signal 106, the snapshot signal 107, and the flip-flop selection signal 108. Moreover, the mode control circuit 81 outputs the address set signal 403.

The memory interface 10 includes a switch 70 for selecting any one of an address signal AS from a bus and a scan chain interconnect 15, a main address FF 71, a switch 77 for selecting any one of the data signal DS and the scan chain interconnect 15, and a main data FF 78.

In the idle mode, the switch 70 selects the address signal AS ("0" side) based on the snapshot signal 107, and the switch 77 selects the data signal DS ("0" side) based on the snapshot signal 107, in order to allow the data signal DS corresponding to an address signal AS from the bus 13 to be output to the bus 13 from the memory 11. As a result, the main address FF 71 latches the address signal AS from the bus 13 and outputs the address signal AS to the memory 11 in synchronization with the main clock signal 105. And the main data FF 78 latches the data signal DS from the memory 11 and outputs the data signal DS to the bus 13 in synchronization with the main clock signal 105.

In the scan-out mode, both the switches 70 and 77 select the scan chain interconnect 15 ("1" side) based on the snapshot signal 107 in order to scan out the latch signal of the main address FF 71 and the latch signal of the main data FF 78 through the scan chain interconnect 15. As a result, each of the main address FF 71 and the main data FF 78 latches the latch signal of the preceding main FF in synchronization with the main clock signal 105, so that the latch signals of each main FF are output from the scan-out terminal 18 through the scan chain interconnect 15.

Since the normal operation is continuously performed even in the scan-out mode, the memory interface 10 has a subsidiary address FF 73, a subsidiary data FF 79, a switch 74 for selecting any one of latch signals of the main address FF 71 and the subsidiary address FF 73 and outputting the latch signal to the memory 11, and a switch 80 for selecting any one of latch signals of the main data FF 78 and the subsidiary data FF 79 and outputting the latch signal to the bus 13.

In the idle mode, the switch 74 selects the main address FF 71 ("0" side) based on the flip-flop selection signal 108, and the switch 80 selects the main data FF 78 ("0" side) based on the flip-flop selection signal 108. As a result, the latch signal of the main address FF 71 obtained by latching the address signal AS from the bus 13 is output to the memory 11 through the switch 74. In addition, the latch signal of the main data FF 78 obtained by latching the data signal DS output from the memory 11 is output to the bus 13 through the switch 80.

In the scan-out mode, the switch 74 selects the subsidiary address FF 73 ("1" side) based on the flip-flop selection signal 108, and the switch 80 selects the subsidiary data FF 79 ("1" side) based on the flip-flop selection signal 108. As a result, the latch signal of the subsidiary address FF 73 obtained by latching the address signal AS from the bus 13 is output to the memory 11 through the switch 74. In addition, the latch signal of the subsidiary data FF 79 obtained by latching the data signal DS output from the memory 11 is output to the bus 13 through the switch 80.

Between the bus 13 and the subsidiary address FF 73, a switch 72 that selects any one of the address signal AS and the scan chain interconnect 15 is provided in order to cause the subsidiary address FF 73 to latch the monitoring address signal in the set mode described below. The switch 72 selects the address signal AS ("0" side) based on the address set signal 403 in operation modes other than the set mode, and selects the scan chain interconnect 15 ("1" side) based on the address set signal 403 in the set mode.

A comparator 75 is provided in order to compare the latch signal of the main address FF 71 in the idle mode and the monitoring address signal latched on the subsidiary address FF 73. The comparator 75 has an active state or an inactive state based on the access monitoring signal 401. In the active state, the latch signal of the main address FF 71 and the monitoring address signal are compared.

When the latch signal of the main address FF 71 is identical to the monitoring address signal, the comparator 75 outputs an internal snapshot start signal 402 having a high level H only for a single period of the main clock signal 105. The scan control unit 14 starts the switching operation from the idle mode to the scan-out mode based on the internal snapshot start signal 402 having a high level H.

The number of flip-flops included in the main address FF 71, the subsidiary address FF 73, the main data FF 78, and the subsidiary data FF 79 corresponds to the number of bits of the signal. Similarly, the number of flip-flops included in the switches 70, 72, 74, 77, and 80 corresponds to the number of bits of the signal.

Figure 15:
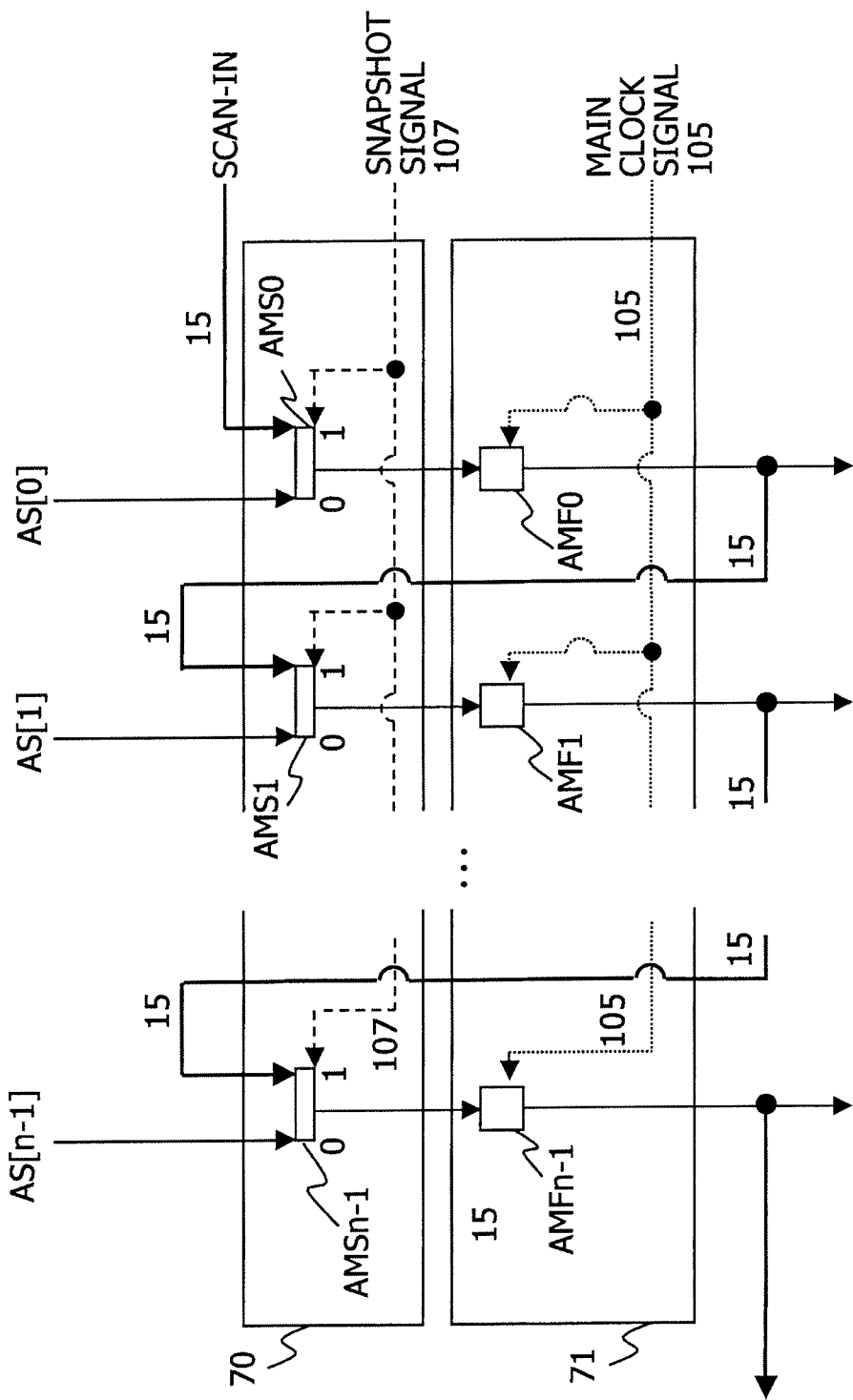
FIG. 15 is a diagram illustrating a configuration of the main address FF according to the fourth embodiment.

FIG. 15 is a diagram illustrating a configuration of the main address FF according to the fourth embodiment. FIG. 15 illustrates configurations of the switch 70 and the main address FF 71 in a case where the address signal AS of n bits is transmitted from the bus 13.

The switch 70 includes switches AMS0 to AMSn−1 for performing selection for each bit. The switch 70 selects the address signal AS (AS[0] to AS[n−1]) of n bits or a signal of the scan chain interconnect 15 based on the snapshot signal 107, and outputs the selected signal.

The main address FF 71 has flip-flops AMF0 to AMFn−1, each of which is connected to the flip-flop in the following stage through the scan chain interconnect 15. The flip-flops AMF0 to AMFn−1 latch the output signals of the corresponding switches AMS0 to AMSn−1 in synchronization with the main clock signal 105.

Therefore, since the switches AMS0 to AMSn−1 select the address signal AS when the snapshot signal 107 has a low level L (idle mode, return mode, and set mode), the flip-flops AMF0 to AMFn−1 can latch the address signal AS of n bits in synchronization with the main clock signal 105.

In addition, since the switches AMS0 to AMSn−1 select a signal of the scan chain interconnect 15 when the snapshot signal 107 has a high level H (snapshot mode and scan-out mode), each of the flip-flops AMF0 to AMFn−1 can latch the latch signal of the flip-flop in the preceding stage through the scan chain interconnect 15 in synchronization with the main clock signal 105.

Figure 16:
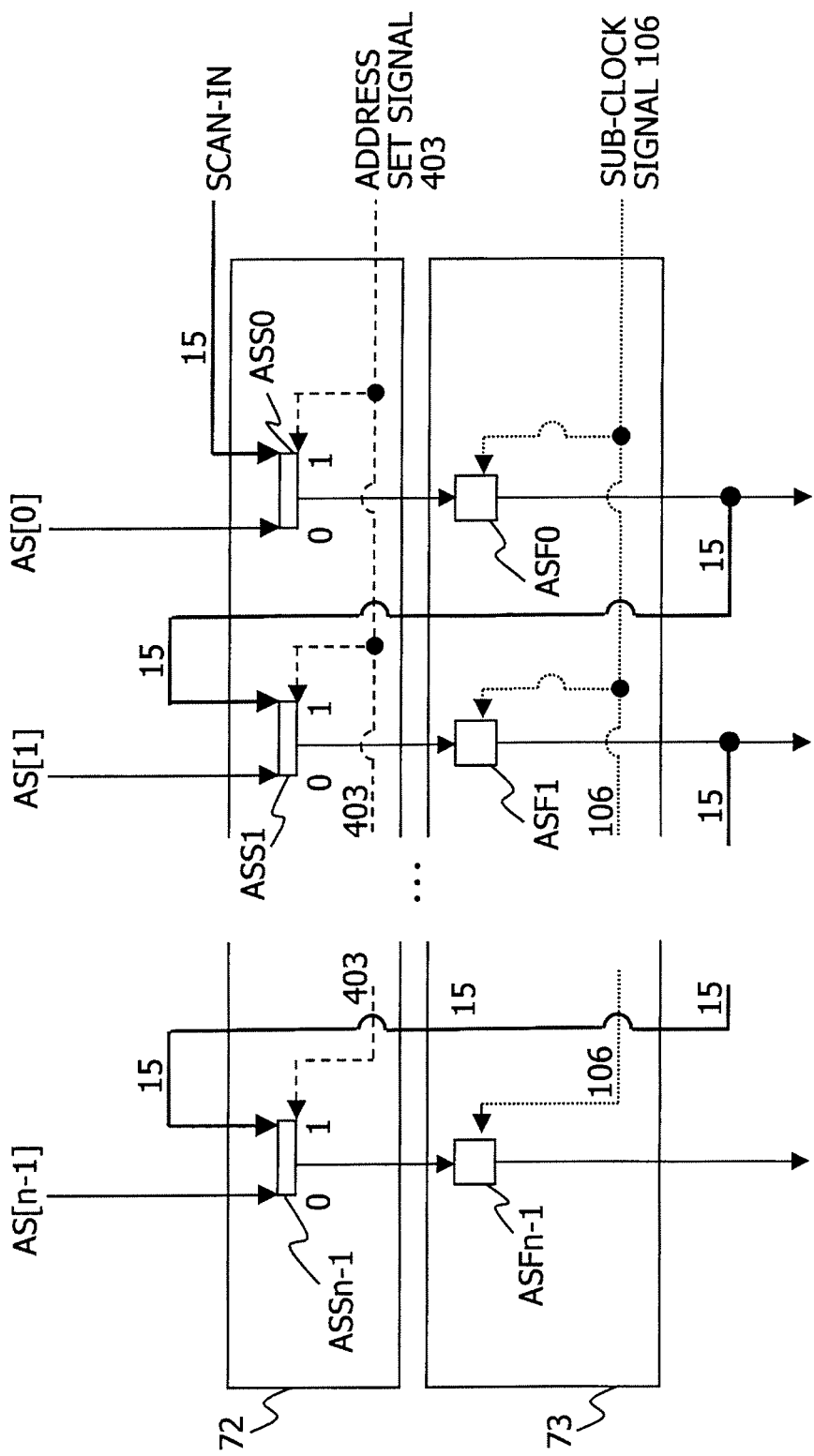
FIG. 16 is a diagram illustrating a configuration of the subsidiary address FF according to the fourth embodiment.

FIG. 16 is a diagram illustrating a configuration of the subsidiary address FF according to the fourth embodiment. FIG. 16 illustrates configurations of the switch 72 and the subsidiary address FF 73 in a case where the address signal AS of n bits is transmitted from the bus 13.

The switch 72 has switches ASS0 to ASSn−1 that perform selection for each bit. The switch 72 selects the address signal AS (AS[0] to AS[n−1]) of n bits or a signal of the scan chain interconnect 15 based on the address set signal 403 and outputs the selected one.

The subsidiary address FF 73 has flip-flops ASF0 to ASFn−1, each of which is connected to the flip-flop of the following stage through the scan chain interconnect 15. The flip-flops ASF0 to ASFn−1 are connected using the scan chain interconnect 15 in order to allow the flip-flops ASF0 to ASFn−1 to latch the monitoring address signal in the set mode. For this reason, the flip-flop ASFn−1 for latching a signal of the n-th bit is not connected to the flip-flop of the following stage. The flip-flops ASF0 to ASFn−1 latch the output signals of the corresponding switches ASS0 to ASSn−1 in synchronization with the sub-clock signal 106.

Therefore, since the switches ASS0 to ASSn−1 select the address signal AS when the address set signal 403 has a low level L (idle mode, snapshot mode, scan-out mode, and return mode), the flip-flops ASF0 to ASFn−1 can latch the address signal AS of n bits in synchronization with the sub-clock signal 106.

In addition, since the switches ASS0 to ASSn−1 select a signal of the scan chain interconnect 15 when the address set signal 403 has a high level H (set mode), the flip-flops ASF0 to ASFn−1 can latch the monitoring address signal of n bits through the scan chain interconnect 15 by inputting the sub-clock signal 106 n times.

Figure 17:
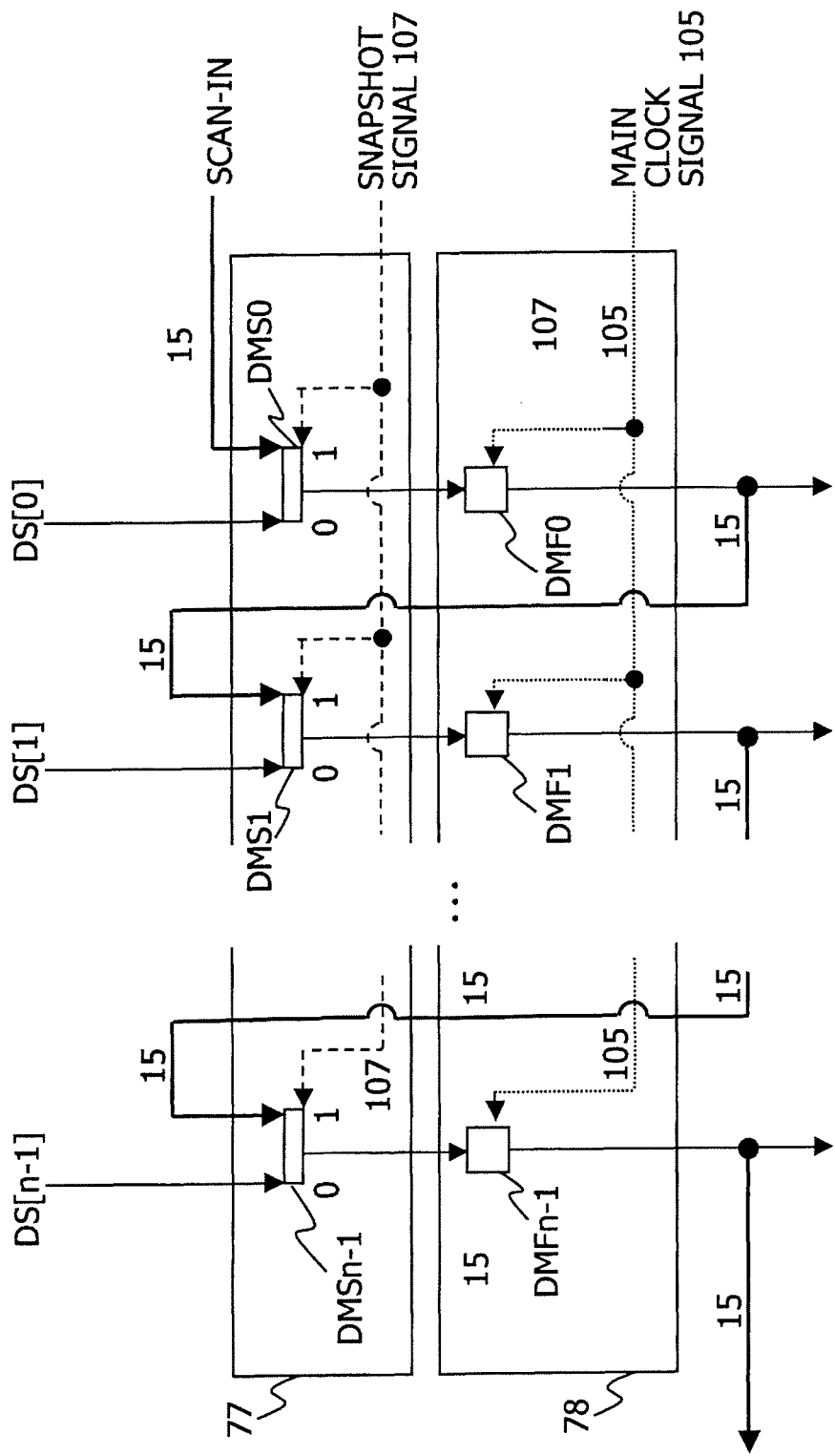
FIG. 17 is a diagram illustrating a configuration of the main data FF according to the fourth embodiment.

FIG. 17 is a diagram illustrating a configuration of the main data FF according to the fourth embodiment. The switch 77 and the subsidiary data FF 78 have the same configurations as those of FIG. 15.

The switch 77 has switches DMS0 to DMSn−1 for performing selection for each bit. The switch 77 selects the data signal DS (DS[0] to DS[n−1]) of n bits or a signal of the scan chain interconnect 15 based on the snapshot signal 107, and outputs the selected one.

The main data FF 78 has flip-flops DMF0 to DMFn−1, each of which is connected to the flip-flop of the following stage through the scan chain interconnect 15. The flip-flops DMF0 to DMFn−1 latch output signals of the corresponding switches DMS0 to DMSn−1 in synchronization with the main clock signal 105.

Therefore, since the switches DMS0 to DMSn−1 select the address signal AS when the snapshot signal 107 has a low level L (idle mode, return mode, and set mode), the flip-flops DMF0 to DMFn−1 can latch the data signal AS of n bits in synchronization with the main clock signal 105.

In addition, since the switches DMS0 to DMSn−1 select a signal of the scan chain interconnect 15 when the snapshot signal 107 has a high level H (snapshot mode and scan-out mode), each of the flip-flops DMF0 to DMFn−1 can latch the latch signal of the flip-flop of the preceding stage through the scan chain interconnect 15 in synchronization with the main clock signal 105.

Figure 18:
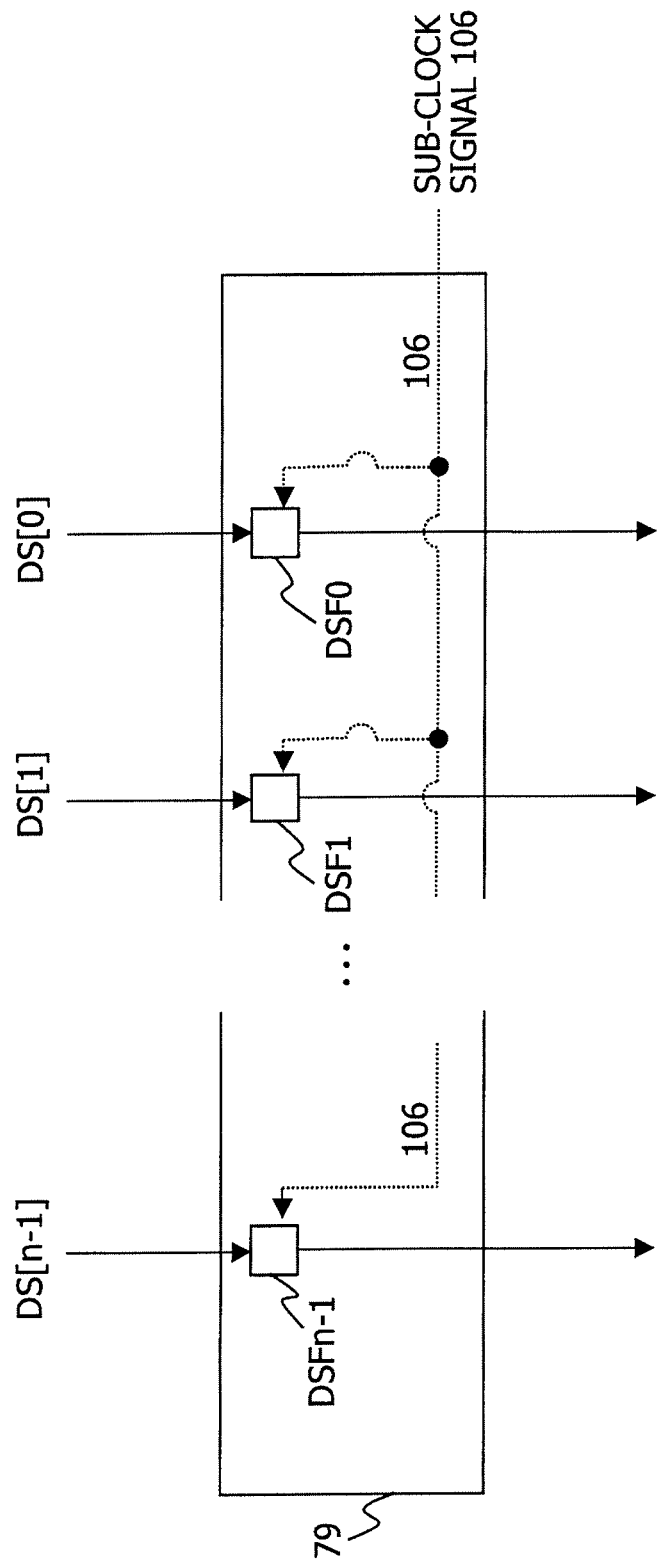
FIG. 18 is a diagram illustrating a configuration of the subsidiary data FF according to the fourth embodiment.

FIG. 18 is a diagram illustrating a configuration of the subsidiary data FF according to the fourth embodiment. In the subsidiary data FF 79, the flip-flops DSF0 to DSFn−1 latch the data signal DS of n bits from the memory in synchronization with the sub-clock signal 106.

Figure 19:
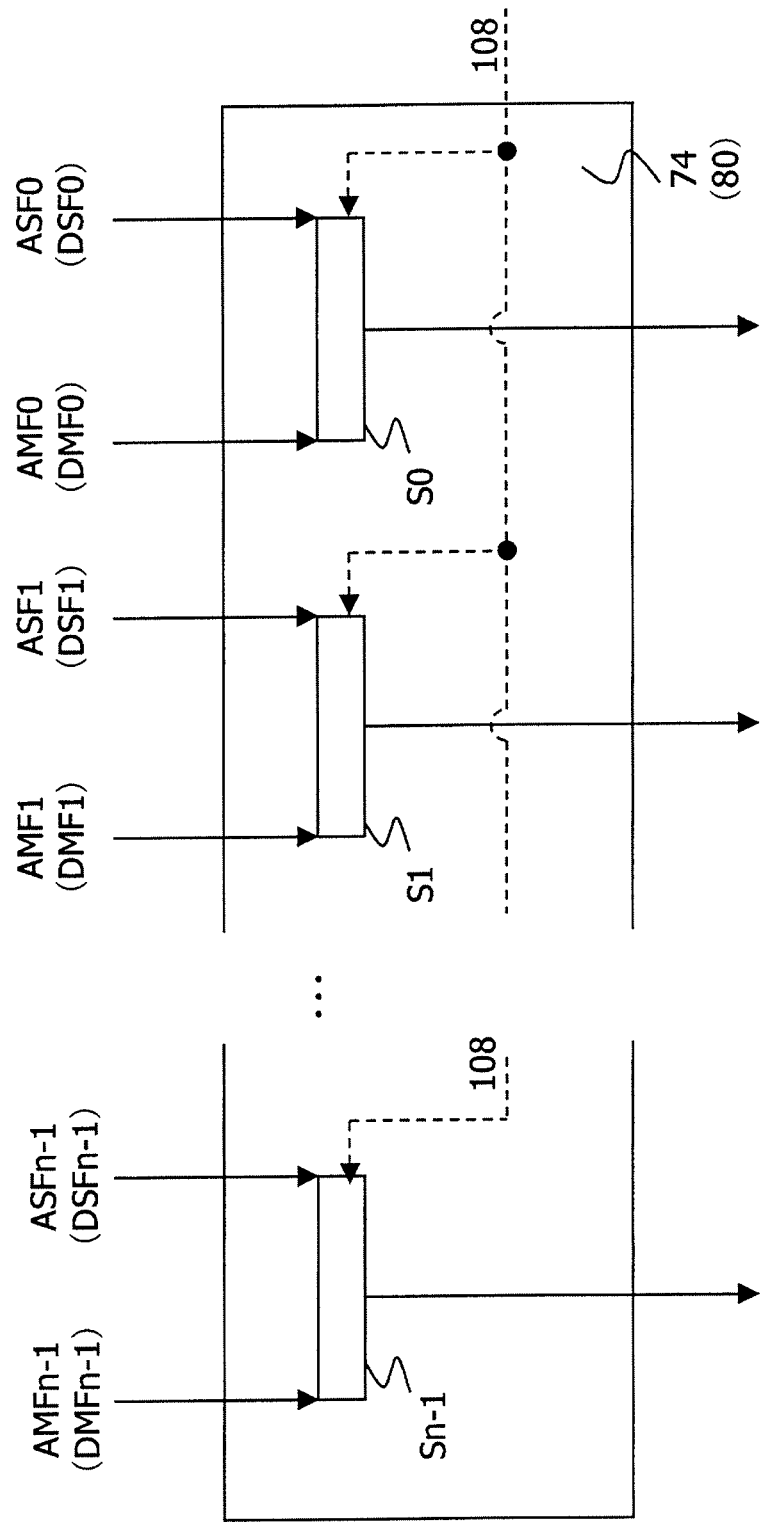
FIG. 19 is a diagram illustrating a configuration of the switch for selecting the latch signal of the flip-flop according to the fourth embodiment.

FIG. 19 is a diagram illustrating a configuration of the switch for selecting the latch signal of the flip-flop according to the fourth embodiment. The switch 74 includes switches S0 to Sn−1 for each bit. Each switch S0 to Sn−1 of the switch 74 selects any one of outputs of the flip-flop AMF0 to AMFn−1 of the main address FF 71 and outputs of the flip-flop ASF0 to ASFn−1 of the subsidiary address FF 72 based on the flip-flop selection signal 108, and outputs the selected one.

The switch 80 also has the same configuration as that of the switch 74. The switches S0 to Sn−1 of the switch 80 select any one of outputs of the flip-flops DMF0 to DMFn−1 of the main data FF 78 and outputs of the flip-flops DSF0 to DSFn−1 of the subsidiary data FF 79 based on the flip-flop selection signal 108, and outputs the selected one.

FIG. 20 is a diagram illustrating a switching condition of the operation mode of the memory interface according to the fourth embodiment. According to the fourth embodiment, the operation of the memory interface 10 is divided into five operation modes (idle mode, snapshot mode, scan-out mode, return mode, and set mode). The idle mode IDLE, the snap-shot mode SS, the scan-out mode SOUT, the return mode RET, and the set mode SET correspond to three bits "000," "010," "011," "001," and "100," respectively, of the SS scan mode signal 101.

In the idle mode IDLE, memory interface 10 continuously performs the idle mode IDLE while the internal snapshot start signal 402 from the comparator 75 has a low level L. However, when the address signal AS latched on the main address FF 71 is identical to the monitoring address signal (internal snapshot start signal 402=high level H) as described below, the scan control unit 14 causes the SS scan mode signal 101 to switch from "000" to "010" and causes the operation of the memory interface 10 to switch to the snapshot mode SS.

In the idle mode IDLE, the snapshot start signal having a high level H and the scan-in signal having a high level H are set as a condition for switching from the idle mode IDLE to the set mode SET in order to allow the debug tool 1 to control a timing for switching from the idle mode IDLE to the set mode SET. If the debug tool 1 inputs the snapshot start signal having a high level H and the scan-in signal having a high level H to the LSI 4, the scan control unit 14 causes the SS scan mode signal 101 to switch from "000" to "100" and causes the operation of the memory interface 10 to switch to the set mode SET.

Switching conditions for the snapshot mode SS, the scan-out mode SOUT, and the return mode RET and operation modes after the switching are similar to those of FIG. 5A of the first embodiment.

In the set mode SET, the snapshot start signal having a high level H and the scan-in signal having a high level H are set as a condition for switching from the set mode SET to the idle mode IDLE in order to allow the debug tool 1 to control a timing for switching from the set mode SET to the idle mode IDLE. If the debug tool 1 inputs the snapshot start signal having a high level H and the scan-in signal having a high level H to the LSI 4, the scan control unit 14 causes the SS scan mode signal 101 to switch from "100" to "000" and causes the operation of the memory interface 10 to switch to the idle mode IDLE.

FIG. 21 is a diagram illustrating an output signal of the mode control circuit according to the fourth embodiment. Signals 105 to 108 in the idle mode IDLE, the snapshot mode SS, the scan-out mode SOUT, and the return mode RET are similar to those of FIG. 5B of the first embodiment. Since the address set signal 403 is retained at a low level L in the idle mode IDLE, the snapshot mode SS, the scan-out mode SOUT, and the return mode RET, the switch 72 retains selection of the address signal AS from the bus 13.

In the set mode SET, the mode control circuit 81, as in the idle mode IDLE, outputs the main clock signal 105 and the flip-flop selection signal 108 and retains the snapshot signal 107 at a low level L. As a result, the memory interface 10 continuously performs the normal operation using the main address FF 71 and the main data FF 78.

In addition, the mode control circuit 81 outputs the SS scan clock signal 102 as a sub-clock signal 106 and retains the address set signal 402 at a high level H. As a result, the switch 72 selects a signal of the scan chain interconnect 15, the subsidiary address FF 73 receives the sub-clock signal 106 n times, and the monitoring address signal of n bits is stored in the flip-flops ASF0 to ASFn−1 through the scan chain interconnect 15.

Figure 22:
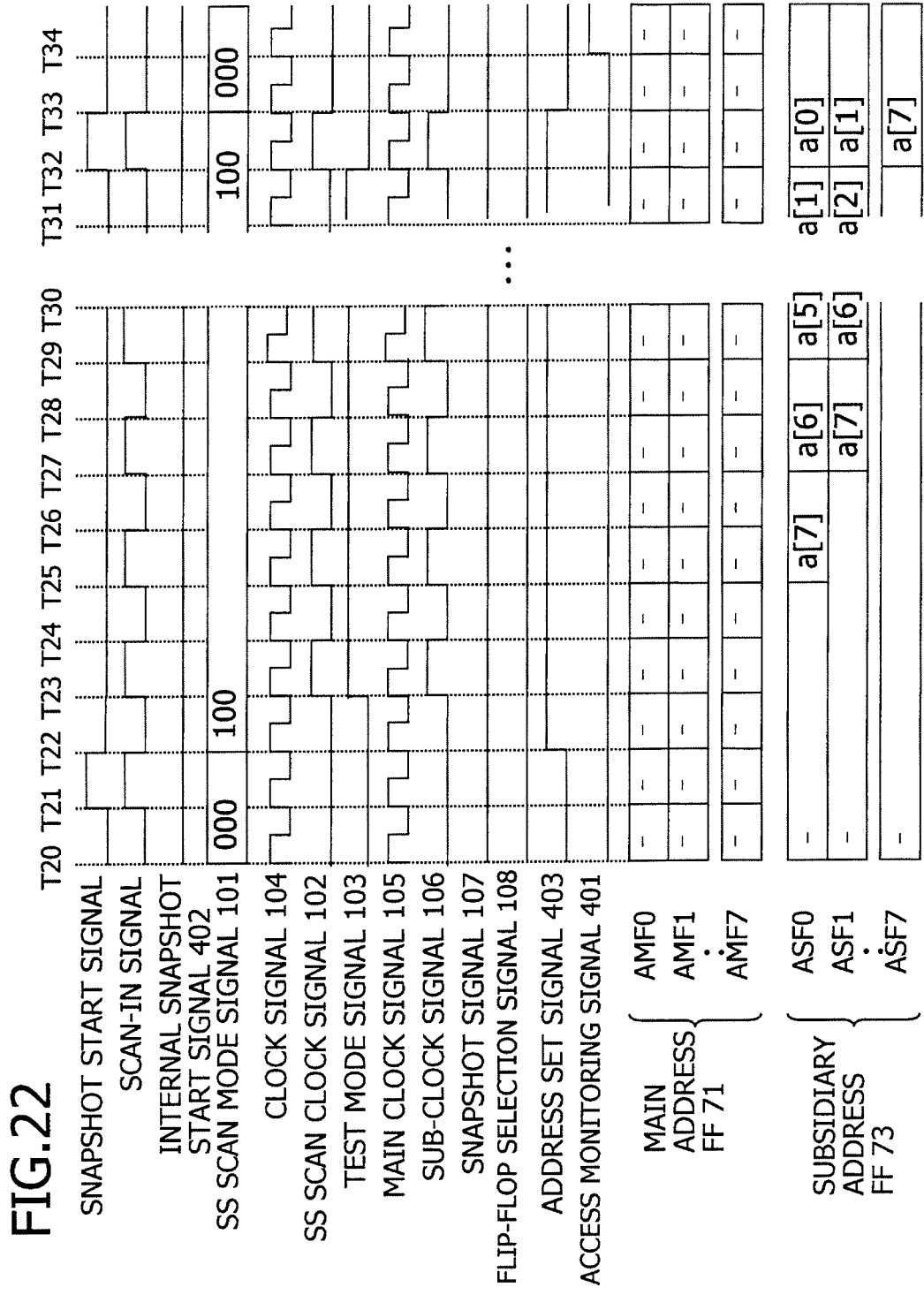
FIG. 22 is a timing chart of the set mode according to the fourth embodiment.

Next, operations will be described in detail with reference to FIGS. 22 and 23. FIG. 22 is a timing chart of the set mode according to the fourth embodiment. It is assumed that an address signal of 8 bits is transmitted from the bus 13, and a read operation to the memory 11 for time T20 to T34 is not performed.

[Idle Mode (Time T20 to T21)]

At time T20, since the SS scan mode signal 101 is set to "000," the memory interface 10 is operated in the idle mode.

In this case, the switch 70 selects the address signal AS ("0" side) from the bus 13, and the switch 74 selects the latch signal of the main address FF 71 ("0" side). In addition, the switch 77 selects the data signal DS ("0" side) from the memory 11, and the switch 80 selects the latch signal of the main data FF 78 ("0" side).

At time T21, in order to start switching from the idle mode to the set mode, the snapshot start signal having a high level H and the scan-in signal having a high level H are input from the debug tool 1 only for a single period of the clock signal 104.

[Set Mode (Time T22 to T32)]

At time T22, the scan control unit 14 causes the SS scan mode signal 101 to switch from "000" to "100" based on the snapshot start signal having a high level H and the scan-in signal having a high level H, and causes the operation of the memory interface 10 to switch from the idle mode to the set mode. In the set mode, the subsidiary address FF 73 latches the monitoring address signal through the scan chain interconnect 15.

The mode control circuit 81 causes the address set signal 403 to switch from a low level L to a high level H based on the SS scan mode signal 101 set to "100." As a result, the switch 72 selects a signal of the scan chain interconnect 15 ("1" side).

In addition, the main control unit 81 continuously outputs the clock signal 104 as a main clock signal 105, and retains the snapshot signal 107 and the flip-flop selection signal 108 at a low level L.

As a result, the switch 70 retains selection of the address signal AS ("0" side) from the bus 13, and the switch 77 retains selection of the data signal DS ("0" side) from the memory. In addition, the switch 74 retains selection of the latch signal ("0" side) of the main address FF 71, and the switch 80 retains selection of the latch signal ("0" side) of the main data FF 78.

For this reason, although not illustrated in FIG. 22, the memory interface 10 can continuously perform the normal operation using the main address FF 71 and the main data FF 78 even when the read operation of the memory 11 is performed during the set mode.

After time T22, the monitoring address signal is input to the scan chain interconnect 15 from the debug tool 1 as a scan-in signal in synchronization with the SS scan clock signal 102.

At time T23, the scan control unit 14 outputs the SS scan clock signal 102 having a period twice that of the clock signal 104. In addition, the test mode signal 103 having a high level H is output from the test mode controller 8. The mode control circuit 81 outputs the SS scan clock signal 102 as a sub-clock signal 106 based on the SS scan clock signal 102 and the test mode signal 103 having a high level H. As a result, the subsidiary address FF 73 can latch the monitoring address signal through the scan chain interconnect 15 in synchronization with the sub-clock signal 106.

At time T25, the flip-flop ASF0 of the subsidiary address FF 73 latches the eighth bit (most significant bit) signal a[7] of the monitoring address signal in response to a rising edge of the sub-clock signal 106. Then, at time T26, the flip-flop ASF1 of the subsidiary address FF 73 latches the latch signal a[7] of the flip-flop ASF0 through the scan chain interconnect 15 in response to a rising edge of the sub-clock signal 106. In addition, the flip-flop ASF0 latches the next seventh bit signal a[6] of the monitoring address signal.

In this manner, since each flip-flop ASF0 to ASF7 of the subsidiary address FF 73 sequentially latches a latch signal of the flip-flop of the preceding stage through the scan chain interconnect 15, each bit signal of the monitoring address signal is sequentially latched on the subsidiary FF 73.

At time T32, overall bit signals a[0] to a[7] of the monitoring address signal are latched on the subsidiary address FF 73. In addition, the test mode controller 8 causes the test mode signal 103 to switch from a high level H to a low level L, and terminates the scan-in operation of the monitoring address signal. Furthermore, in order to allow the memory interface 10 to switch from the set mode to the idle mode, the snapshot start signal having a high level H and the scan-in signal having a high level H are input from the debug tool 1 for a single period of the clock signal 104.

[Idle Mode (Time T33 to T34)]

At time T33, the scan control unit 14 causes the SS scan mode signal 101 to switch from "100" to "000" based on the snapshot start signal having a high level H and the scan-in signal having a high level H, and causes the operation of the memory interface 10 to switch from the set mode to the idle mode. At the same time, the scan control unit 14 retains the SS scan clock signal 102 at a low level L.

Furthermore, the scan control unit 14 causes the access monitoring signal 401 to switch from a low level L to a high level H at time T33. As a result, the comparator 75 starts comparison between the latch signal of the main address FF 71 and the monitoring address signal latched on the subsidiary address FF 73. As described below, in a case where the latch signal of the main address FF 71 is identical to the monitoring address signal, the operation for switching from the idle mode to the scan-out mode starts.

Meanwhile, the mode control circuit 81 causes the sub-clock signal 106 and the address set signal 403 to switch from a high level H to a low level L and retains the snapshot signal 107 at a low level L, which is the same level as that of the test mode signal 103.

As a result, similar to the idle mode at time T20 to T21, the switches 70 and 72 select the address signal AS ("0" side) from the bus 13, and the switch 77 selects the data signal DS from the memory 11 ("0" side). However, unlike time T20 to T21, the subsidiary address FF 73 retains the monitoring address signal.

For this reason, after time T33, the memory interface 10 can compare the latch signal of the main address FF 71 and the monitoring address signal using the comparator 75 while the normal operation is performed.

In this manner, in the set mode, the memory interface 10 latches the address monitor signal on the subsidiary address FF 73. Similarly, in the set mode, the switches 70, 74, 77, and 80 retain selection of the idle mode. Therefore, the memory interface 10 can perform the normal operation even when the read operation of the memory 11 is performed during the set mode. As the operation mode switches from the set mode to the idle mode, the memory interface 10 starts comparison regarding whether or not the latch signal of the main address FF 71, that is, the address signal AS from the bus 13 is identical to the monitoring address signal.

Figure 23:
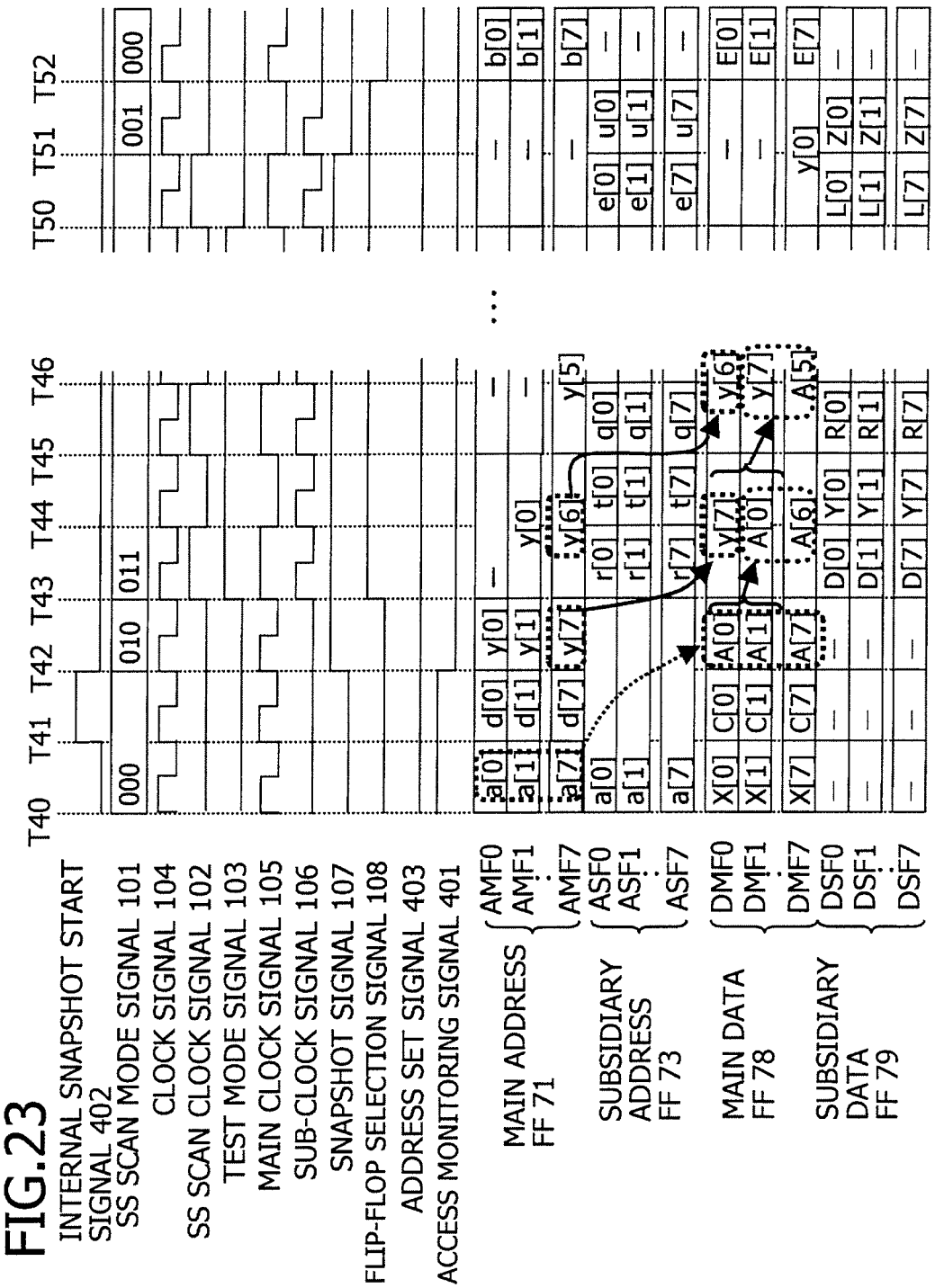
FIG. 23 is a timing chart of the scan-out operation in the memory interface according to the fourth embodiment.

FIG. 23 is a timing chart of the scan-out operation in the memory interface according to the fourth embodiment. FIG. 23 illustrates a specific example of the operation for causing the memory interface 10 to switch from the idle mode to the scan-out mode in the idle mode after the set mode and scan out latch signals of the main address FF 71 and the main data FF 78.

In FIG. 23, first, the LSI 4 retains the monitoring address signal in the subsidiary address FF 73 of the memory interface 10 in the set mode, and then, performs the read operation of the memory 11 before T40. Whenever the main address FF 71 latches the address signal AS, the memory interface 10 performs comparison between the address signal AS latched on the main address FF 71 and the monitoring address signal latched on the subsidiary address FF 73. In addition, in a case where the address signal AS latched on the main address FF 71 is identical to the monitoring address signal latched on the subsidiary address FF 73 (time T40), the memory interface 10 starts switching from the idle mode to the scan-out mode (time T41 to T42).

In the scan-out mode (time T43 to T50), the memory interface 10 can continuously perform the normal operation using the subsidiary address FF 73 and the subsidiary data FF 79. The latch signals of the main address FF 71 and the main data FF 78 are scanned out through the scan chain interconnect 15. After completing the scan-out operation, the memory interface 10 starts switching from the scan-out mode to the idle mode (time T51).

In addition, returning to the idle mode before the monitor address is retained in the set mode (time T52), the memory interface 10 performs the normal operation without comparison between the address signal AS latched on the main address FF 71 and the monitoring address signal latched on the subsidiary address FF 73.

Hereinafter, description will be made in more detail.

[Idle Mode (Time T40 to T41)]

At time T40, the memory interface 10 is operated in the idle mode after the set mode. That is, the switch 70 selects the address signal AS from the bus 13, the switch 74 selects the latch signal of the main address FF 71, the switch 77 selects the data signal DS from the memory 11, and the switch 80 selects the latch signal of the main data FF 78.

For this reason, the main data FF 78 latches the data signal DS (X[0] to X[7]) output from the memory 11 before time T40 in synchronization with the main clock signal 105. As a result, the data signal DS (X[0] to X[7]) is output to the bus 13.

The memory 11 outputs the data signal DS (C[0] to C[7]) corresponding to the address signal AS (c[0] to c[7]) latched on the main address FF 71 before time T40.

In addition, the main address FF 71 latches the address signal AS (a[0] to a[7]) in synchronization with the main clock signal 105.

At the same time, the address signal AS (a[0] to a[7]) latched on the main address FF 71 is input to the comparator 75 and is also compared with the monitoring address signal (a[0] to a[7]) latched on the subsidiary address FF 73 in the set mode. At time T40, since the address signal AS (a[0] to a[7]) is identical to the monitoring address signal (a[0] to a[7]), the output of the comparator 75 has a high level H.

At time T41, the flip-flop 76 latches the high level H output from the comparator 75 at time T40 in synchronization with the main clock signal 105. As a result, the internal snapshot start signal 402 has a high level H. Consequently, the scan control unit 14 detects that the address signal AS is identical to the monitoring address signal and starts the operation subsequent to time T42 described later.

The main data FF 78 latches the data signal DS (C[0] to C[7]) output from the memory 11 at time T40 in synchronization with the main clock signal 105. As a result, the data signal DS (C[0] to C[7]) is output to the bus 13.

The memory 11 outputs the data signal DS (A[0] to A[7]) corresponding to the address signal AS (a[0] to a[7]) latched on the main address FF 71 at time T40.

The main address FF 71 latches the address signal (d[0] to d[7]) from the bus 13 in synchronization with the main clock signal 105. The address signal (d[0] to d[7]) is input to the comparator 75. Since the address signal (d[0] to d[7]) is different from the monitoring address signal, the output of the comparator 75 has a low level L.

[Snapshot Mode (Time T42)]

At time T42, first, the flip-flop 76 latches the low level L output from the comparator 75 at time T41 in synchronization with the main clock signal 105. As a result, the internal snapshot start signal 402 has a low level L.

The main data FF 78 latches the data signal DS (A[0] to A[7]) corresponding to the address signal AS (a[0] to a[7]) output from the memory 11 at time T41 in synchronization with the main clock signal 105. As a result, the data signal DS (A[0] to A[7]) is output to the bus 13.

The memory 11 outputs the data signal DS (D[0] to D[7]) corresponding to the address signal AS (d[0] to d[7]) latched on the main address FF 71 at time T41.

The main address FF 71 latches the address signal (y[0] to y[7]) from the bus 13 in synchronization with the main clock signal 105.

Meanwhile, the scan control unit 14 causes the SS scan mode signal 101 to switch from "000" to "010" based on a rising edge of the internal snapshot start signal 402 at time T41. At the same time, the scan control unit 14 causes the access monitoring signal 401 to switch from a high level H to a low level L, and terminates the comparison operation by setting the comparator 75 to an inactive state.

By virtue of switching of the SS scan mode signal 101, the operation of the memory interface 10 switches from the idle mode to the snapshot mode. In the snapshot mode, the memory interface 10 performs a transitional operation until the operation of the scan-out mode described below starts.

In addition, the mode control circuit 81 sets the snapshot signal 107 to a high level H based on the SS scan mode signal 101 set to "010." As a result, the switches 70 and 77 select the signal of the scan chain interconnect 15 ("1" side).

[Scan-Out Mode (Time T43 to T50)]

At time T43 after a single clock of the clock signal 104 elapses from time T42, the scan control unit 14 causes the SS scan mode signal 101 to switch from "010" to "011." At the same time, the scan control unit 14 outputs the SS scan clock signal 102 having a period twice that of the clock signal 104.

By virtue of switching of the SS scan mode signal 101, the operation of the memory interface 10 switches from the snapshot mode to the scan-out mode.

At this time, the test mode controller 8 outputs the test mode signal 103 having a high level H in response to the test start signal, which indicates the test start, output from the debug tool 1 in order to start the scan-out operation of the main address FF 71 and the main data FF 78.

First, based on the SS scan mode signal 101 set to "011" and the test mode signal 103 having a high level H, the mode control circuit 81 outputs the clock signal 104 as a sub-clock signal 106 and retains the address set signal 403 at a low level L.

As a result, the switch 72 retains selection of the address signal AS from the bus 13 ("0" side) based on the address set signal 403 having a low level L.

In addition, the subsidiary data FF 79 latches the data signal DS (D[0] to D[7]) output from the memory 11 at time T42 in synchronization with the sub-clock signal 106.

The memory 11 outputs the data signal (Y[0] to Y[7]) corresponding to the address signal AS (y[0] to y[7]) latched on the main address FF 71 at time T42.

The subsidiary address FF 73 latches the address signal AS (r[0] to r[7]) from the bus 13 in synchronization with the sub-clock signal 106.

Meanwhile, based on the SS scan mode signal 101 set to "011" and the test mode signal 103 having a high level H, the mode control circuit 81 outputs the SS scan clock signal 102 as a main clock signal 105, retains the snapshot signal 107 at a high level H, and sets the flip-flop selection signal 108 to a high level H.

As a result, the switches 70 and 77 retain selection of the signal of the scan chain interconnect 15 ("1" side). In addition, the switch 74 selects the latch signal of the subsidiary address FF 73 ("1" side), and the switch 80 selects the latch signal of the subsidiary data FF 79 ("1" side).

As a result, the data signal DS (D[0] to D[7]) latched on the subsidiary data FF 79 is output to the bus 13.

Each flip-flop AMF0 to AMF7 of the main address FF 71 and each flip-flop DMF0 to DMF7 of the main data FF 78 latch the latch signals of the flip-flops of the preceding stage through the scan chain interconnect 15 in synchronization with the main clock signal 105. That is, a scan-out operation of the main address FF 71 and the main data FF 78 starts. As a result, at time T43, the latch signal of the flip-flop DMF7 at time T42, that is, the most significant bit "A[7]" of the data signal DS (A[0] to A[7]) is output from the scan-out terminal 18.

At time T44, the subsidiary data FF 79 latches the data signal DS (Y[0] to Y[7]) output from the memory 11 at time T43 in synchronization with the sub-clock signal 106. As a result, the data signal DS (Y[0] to Y[7]) is output to the bus 13.

The memory 11 outputs the data signal (R[0] to R[7]) corresponding to the address signal AS (r[0] to r[7]) latched on the subsidiary address FF 73 at time T43.

The subsidiary address FF 73 latches the address signal AS (t[0] to t[7]) from the bus 13 in synchronization with the sub-clock signal 106.

In this manner, the memory interface 10 continuously performs the normal operation using the subsidiary address FF 73 and the subsidiary data FF 79.

At time T45, each flip-flop AMF0 to AMF7 of the main address FF 71 and each flip-flop DMF0 to DMF7 of the main data FF 78 latch the latch signals of the flip-flops of the preceding stage through the scan chain interconnect 15 in synchronization with the main clock signal 105. As a result, at time T44, the latch signal "A[6]" of the flip-flop DMF7 at time T43 is output from the scan-out terminal 18.

The subsidiary data FF 79 latches the data signal DS (R[0] to R[7]) output from the memory 11 at time T44 in synchronization with the sub-clock signal 106. As a result, the data signal DS (R[0] to R[7]) is output to the bus 13.

The memory 11 outputs the data signal (T[0] to T[7]) corresponding to the address signal AS (t[0] to t[7]) latched on the subsidiary address FF 73 at time T43.

The subsidiary address FF 73 latches the address signal AS (q[0] to q[7]) from the bus 13 in synchronization with the sub-clock signal 106.

In this manner, after time T44, the memory interface 10 scans out the latch signals of the main address FF 71 and the main data FF 78 while the normal operation is continuously performed.

[Return Mode (Time T51)]

At time T50, the scan-out target latch signal is only set to "y[0]," and the test mode controller 8 causes the test mode signal 103 to switch from a high level H to a low level L in response to the test start signal, which indicates test termination, output from the debug tool 1 in order to terminate the scan-out operation of the main address FF 71 and the main data FF 78.

As a result, at time T51, the scan control unit 14 causes the SS scan mode signal 101 to switch from "011" to "001" and causes the operation of the memory interface 10 to switch from the scan-out mode to the return mode. In the return mode, the memory interface 10 performs a transitional operation until the operation of the idle mode starts.

First, the mode control circuit 81 outputs the clock signal 104 as a sub-clock signal 106, retains the flip-flop selection signal 108 at a high level H, and retains the address set signal 403 at a low level L.

As a result, the switch 72 retains selection of the address signal AS from the bus 13 ("0" side) based on the address set signal 403 having a low level L. The switch 74 retains selection of the latch signal of the subsidiary address FF 73 ("1" side) based on the flip-flop selection signal 108 having a high level H. In addition, the switch 80 retains selection of the latch signal of the subsidiary data FF 79 ("1" side) based on the flip-flop selection signal 108 having a high level H.

The subsidiary data FF 79 latches the data signal DS (Z[0] to Z[7]) output from the memory 11 at time T50 in synchronization with the sub-clock signal 106. As a result, the data signal DS (Z[0] to Z[7]) is output to the bus 13.

The memory 11 outputs the data signal DS (E[0] to E[7]) corresponding to the address signal (e[0] to e[7]) latched on the subsidiary address FF 73 at time T50.

The subsidiary address FF 73 latches the address signal AS (u[0] to u[7]) from the bus in synchronization with the sub-clock signal 106.

Meanwhile, the mode control circuit 81 outputs the SS scan clock signal 102 as a main clock signal 105 and sets the snapshot signal 107 to a low level L.

As a result, the switch 70 selects the address signal AS from the bus 13 ("0" side) based on the snapshot signal 107 having a low level L. In addition, the switch 77 selects the data signal DS from the memory 11 based on the snapshot signal 107 having a low level L ("0" side).

[Idle Mode (Time T52)]

At time T52 after a single clock of the clock signal 104 elapses from time T51, the scan control unit 14 causes the SS scan mode signal 101 to switch from "01" to "00" and causes the memory interface 10 to switch from the return mode to the idle mode. At the same time, the scan control unit 14 retains the SS scan clock signal 102 at a low level L.

First, the mode control circuit 81 outputs the clock signal 104 as a main clock signal 105 and outputs the test mode signal 103 having a low level L as a snapshot signal 107.

As a result, the switch 70 retains selection of the address signal AS from the bus 13 ("0" side) based on the snapshot signal 107 having a low level L. The switch 77 retains selection of the data signal DS from the memory 11 ("0" side) based on the snapshot signal 107 having a low level L.

The main data FF 78 latches the data signal DS (E[0] to E[7]) output from the memory 11 at time T51 in synchronization with the main clock signal 105. As a result, the data signal DS (E[0] to E[7]) is output to the bus 13.

The memory 11 outputs the data signal DS (U[0] to U[7]) corresponding to the address signal AS (u[0] to u[7]) latched on the subsidiary address FF 73 at time T51.

The main address FF 71 latches the address signal AS (b[0] to b[7]) from the bus 13 in synchronization with the main clock signal 105.

Meanwhile, the mode control circuit 81 sets the sub-clock signal 106 and the flip-flop selection signal 108 to a low level L and retains the address set signal 403 at a low level L.

As a result, the switch 72 retains selection of the address signal AS from the bus 13 ("0" side) based on the address set signal 403 having a low level L. The switch 74 selects the main address FF 71 ("0" side) based on the flip-flop selection signal 108 having a low level L. In addition, the switch 80 selects the main data FF 78 ("0" side) based on the flip-flop selection signal 108 having a low level L.

In this manner, since the switches 70, 72, 74, 77, and 80 after time T52 have the same selection states as those of the idle mode of time T40, the memory interface 10 can perform the normal operation using the main address FF 71 and the main data FF 73. As described above, in FIG. 23, in the idle mode performed after the subsidiary address FF 73 latches the monitoring address signal in the set mode, an operation for switching from the idle mode to the scan-out mode starts as the main address FF 71 latches the address signal AS identical to the monitoring address signal. In addition, the data signal DS corresponding to the address signal AS identical to the monitoring address signal is latched on the main data FF 78. In the scan-out mode, the memory interface 10 scans out the data signal DS corresponding to the monitoring address signal, that is, data for a desired address from the main data FF 78 while the normal operation is continuously performed using the subsidiary address FF 73 and the subsidiary data FF 79.

Fifth Embodiment

In the fourth embodiment described above, data for a desired address is not scanned out if the data for a desired address is not read during the read operation of the memory 11 using the LSI 4 even when the subsidiary address FF 73 latches the monitoring address signal in the set mode. In addition, in a case where there is a failure state such as program overrunning or bus hang-up even when the LSI 4 is operated, there is a possibility that the read operation of the memory 11 is not performed by the LSI 4. Therefore, it is difficult to scan out the data for a desired address.

In this regard, according to the fifth embodiment, description will be made for a memory interface 10 capable of scanning out data for a desired address using a timing that the read operation of the memory 11 is not performed by the LSI 4.

According to the fifth embodiment, the LSI 4 has a configuration similar to that of FIG. 13 as in the fourth embodiment. Similar to the fourth embodiment, the set mode is provided. However, the memory interface 10 or the main address FF 82 has a different configuration from that of FIG. 23 or 24 described below.

The memory interface 10 uses a validity signal YS transmitted along with the address signal AS from the bus 13 in order to switch from the idle mode to the scan-out mode at a timing that the read operation of the memory 11 is not performed by the LSI 4. The validity signal YS indicates whether or not the address signal AS is valid. The validity signal YS transmitted through the bus 13 when the read operation of the memory 11 is performed by the LSI 4 indicates that the address signal AS is "valid."

Therefore, when the validity signal YS indicates an "invalid" state in the idle mode after the set mode, that is, when the main address FF 82 described below does not latch a valid address signal AS, an operation for switching from the idle mode to the scan-out mode starts. In addition, the monitoring address signal latched on the subsidiary address FF is input to the memory, and the data signal DS of the corresponding memory is latched on the main data FF 78 and is scanned out in the scan-out mode.

That is, the operation of the memory interface 10 switches from the idle mode to the scan-out mode, and data for a desired address is scanned out at a timing that reading to the memory 11 is not performed while the LSI 4 is operated. As a result, it is possible to read and scan out data for a desired address from the memory while the LSI 4 is continuously operated.

Figure 24:
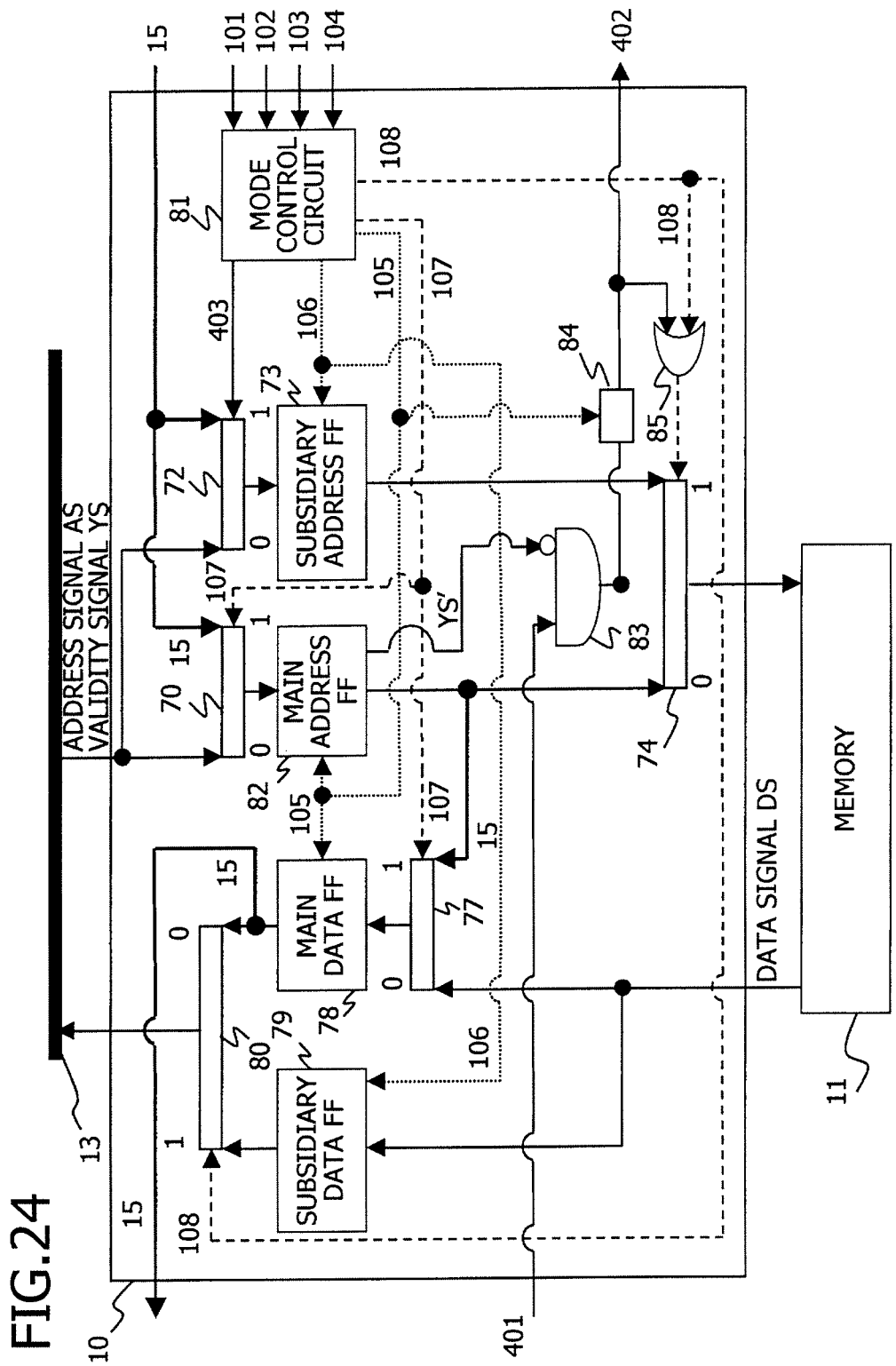
FIG. 24 is a diagram illustrating a configuration of the memory interface according to the fifth embodiment, where like reference numerals denote like elements as in FIG. 14.

FIG. 24 is a diagram illustrating a configuration of the memory interface according to the fifth embodiment, where like reference numerals denote like elements as in FIG. 14. FIG. 24 is different from FIG. 14 in that the memory interface 10 has a main address FF 82, an AND-gate 83, a flip-flop 84, and an OR-gate 85 having the configurations of FIG. 25 described below.

The main address FF 82 latches the address signal AS and the validity signal YS from the bus 13. The latch signal of the main address FF 82 is input to the switch 74 and the scan chain interconnect 15. However, a signal level of the latch signal YS' for the validity signal YS out of the latch signals of the main address FF 82 is inverted and is input to the AND-gate 83 along with the access monitoring signal 401.

The output signal of the AND-gate 83 is output to the scan control unit 14 as an internal snapshot start signal 402 through the flip-flop 84. In addition, the output signal of the AND-gate 83 is input to the OR-gate 85 along with the flip-flop selection signal 108.

The output signal of the OR-gate 85 is input to the switch 74. In addition, the switch 74 selects any one of the latch signal of the main address FF 82 and the latch signal of the subsidiary address FF 73 based on the output signal of the OR-gate.

Figure 25:
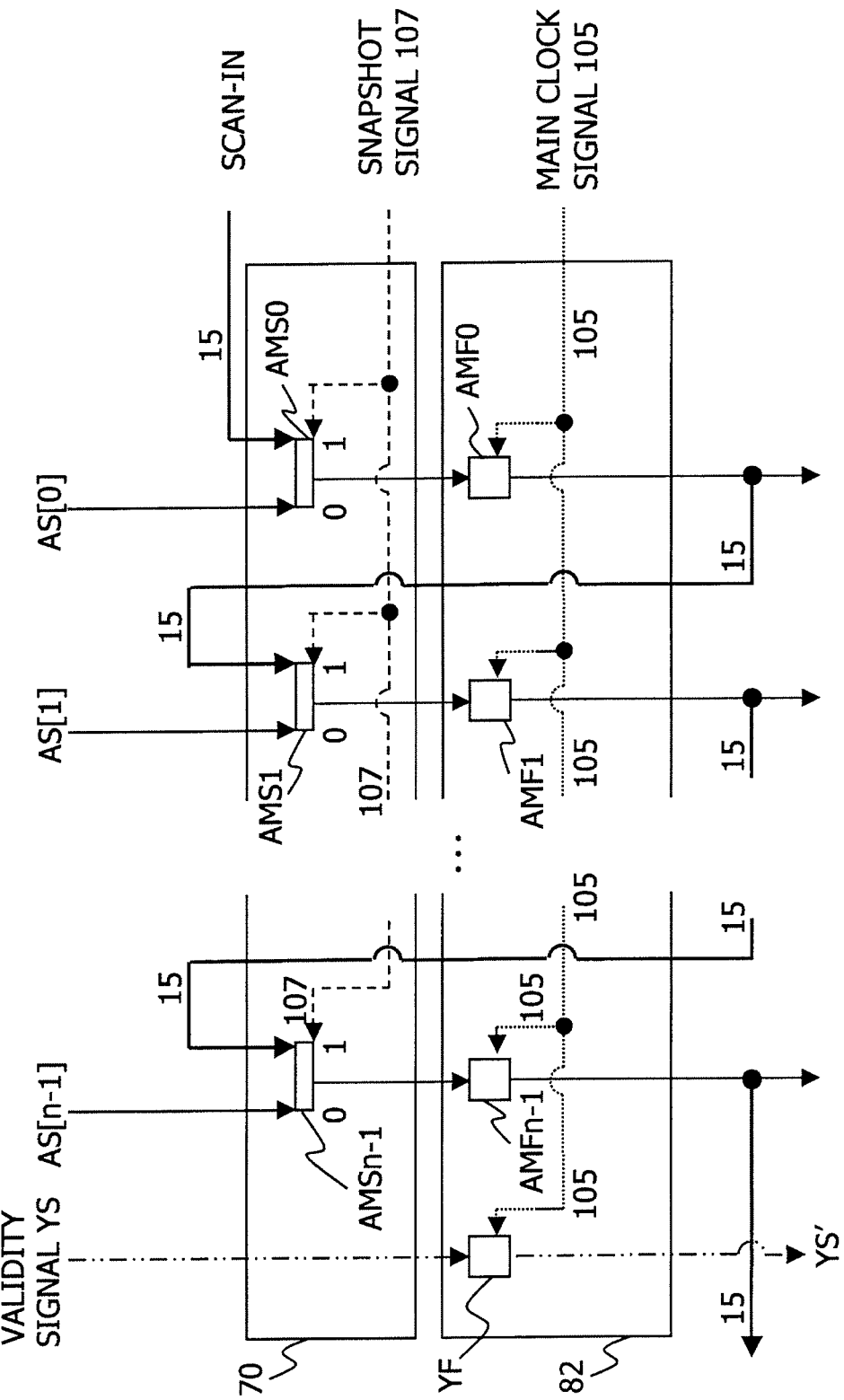
FIG. 25 is a diagram illustrating a configuration of the main address FF according to the fifth embodiment, where like reference numerals denote like elements as in FIG. 15.

FIG. 25 is a diagram illustrating a configuration of the main address FF according to the fifth embodiment, where like reference numerals denote like elements as in FIG. 15. The flip-flops AMF0 to AMFn−1 of the main address FF 82 latch output signals of the corresponding switches AMS0 to AMSn−1 in synchronization with the main clock signal 105. In addition, the main address FF 82 has a flip-flop YF for latching the validity signal YS in synchronization with the main clock signal 105.

Figure 26:
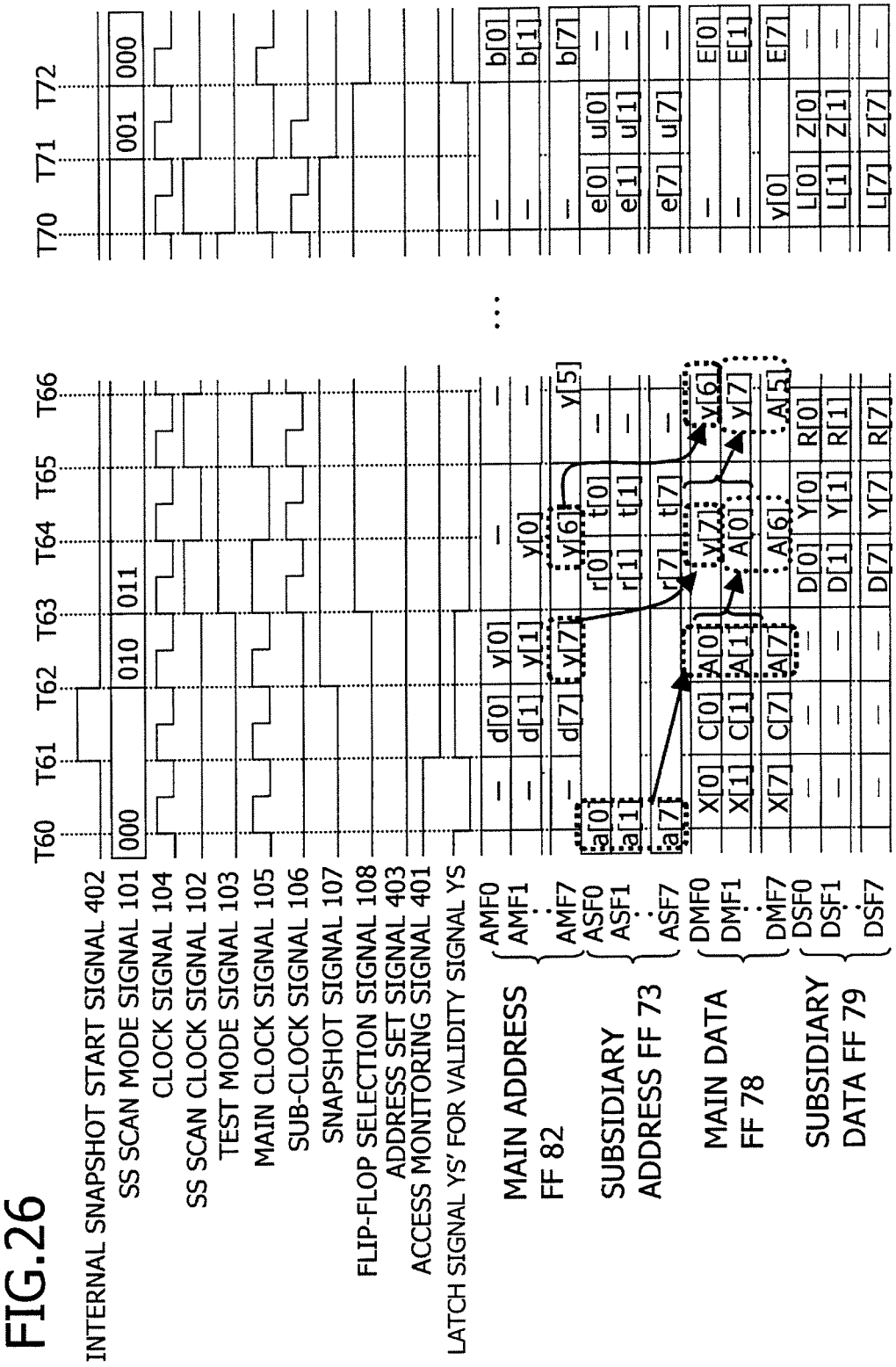
FIG. 26 is a timing chart of the scan-out operation using the memory interface according to the fifth embodiment.

FIG. 26 is a timing chart of the scan-out operation using the memory interface according to the fifth embodiment. FIG. 26 illustrates a specific example of the operation in which the memory interface 10 switches from the idle mode to the scan-out mode in the idle mode after the set mode and scans out the latch signals of the main address FF 82 and the main data FF 78. In FIG. 26, similar to the fourth embodiment, the LSI 4 retains the monitoring address signal in the subsidiary address FF 73 in the set mode and then performs the normal operation before time T60. Therefore, since the access monitoring signal 401 is retained at a high level H, the AND-gate 83 outputs a high level H or a low level L depending on the latch signal YS' of the validity signal YS. That is, the AND-gate 83 has a monitoring state for determining whether or not the validity signal YS indicates "invalid (low level L)."

When the validity signal YS indicates "invalid (low level L)" (output level of the AND-gate 83=high level H), that is, when the main address FF 82 described below does not latch a valid address signal (time T60), the memory interface 10 starts switching from the idle mode to the scan-out mode (time T61 to T62).

In the scan-out mode (time T63 to T70), the memory interface 10 continuously performs the normal operation using the subsidiary address FF 73 and the subsidiary data FF 79, and scans out the latch signals of the main address FF 82 and the main data FF 78 through the scan chain interconnect 15. After completing the scan-out operation, the memory interface 10 starts switching from the scan-out mode to the idle mode (time T71).

The memory interface 10 returns to the idle mode before storing the monitoring address in the set mode (time 172) and performs the normal operation.

Hereinafter, description will be made in more detail.

[Idle Mode (Time T60 to T61)]

At time T60, the memory interface 10 is operated in the idle mode after the set mode. That is, the switch 70 selects the address signal AS from the bus 13, the switch 74 selects the latch signal of the main address FF 71, the switch 77 selects the data signal DS from the memory 11, and the switch 80 selects the latch signal of the main data FF 78.

For this reason, the main data FF 78 latches the data signal DS (X[0] to X[7]) output from the memory 11 before time T60 in synchronization with the main clock signal 105. As a result, the data signal DS (X[0] to X[7]) is output to the bus 13.

The memory 11 outputs the data signal DS (C[0] to C[7]) corresponding to the address signal AS (c[0] to c[7]) latched on the main address FF 82 before time T60.

At time T60, since the address signal AS is not transmitted from the bus 13, the address signal AS is not latched on the flip-flops AMF0 to AMF7 of the main address FF 82. In addition, the flip-flop YF of the main address FF 82 latches the validity signal YS having a low level L, which indicates "invalid," from the address bus 13 and outputs the latch signal YS' having a low level L. That is, at time T60, the main address FF 82 detects that the address signal AS is not valid.

The latch signal YS' for the validity signal YS having a low level L, which indicates "invalid," is inverted and is input to the AND-gate 83 along with the access monitoring signal 401 having a high level H (monitoring state) supplied from the scan control unit 14 of FIG. 13. As a result, the AND-gate 83 determines that the validity signal YS indicates "invalid" and outputs the output signal having a high level H.

At time T61, the flip-flop 84 latches the output signal having a high level H from the AND-gate 83 at time T60 in synchronization with the main clock signal 105. As a result, the internal snapshot start signal 402 has a high level H.

As a result, the scan control unit 14 detects that the main address FF 82 does not latch a valid address signal AS (that is, the AND-gate 83 has a monitoring state, and a read operation of the memory 11 is not performed) and starts operations subsequent to time T62 described below. In addition, the scan control unit 14 causes the access monitoring signal to switch from a high level H (monitoring state) to a low level L in response to a rising edge of the internal snapshot start signal 402 and causes the AND-gate 83 to have an idle state in which determination of the validity signal YS is not performed. As a result, the output signal of the AND-gate 83 is set to a low level L.

The OR-gate 85 receives the internal snapshot start signal 402 having a high level H and outputs the output signal having a high level H. The switch 74 selects the latch signal of the subsidiary address FF 73 ("1" side) based on the output signal having a high level H from the OR-gate 85. As a result, the monitoring address signal (a[0] to a[7]) is input to the memory 11 from the subsidiary address FF 73. In addition, the memory 11 outputs the data signal DS (A[0] to A[7]) corresponding to the monitoring address signal (a[0] to a[7]).

The main data FF 78 latches the data signal DS (C[0] to C[7]) output from the memory 11 at time T60 in synchronization with the main clock signal 105. As a result, the data signal DS (C[0] to C[7]) is output to the bus 13.

The main address FF 82 latches the address signal AS (d[0] to d[7]) and the validity signal YS having a high level H from the bus 13 in synchronization with the main clock signal 105.

[Snapshot Mode (Time T62)]

At time T62, first, the flip-flop 84 latches the output signal having a low level L from the AND-gate 83 at time T61 in synchronization with the main clock signal 105. As a result, the internal snapshot start signal 402 has a low level L.

The OR-gate 85 receives the internal snapshot start signal 402 having a low level L and the flip-flop selection signal 108 having a low level L, and the output signal of the OR-gate 85 switches from a high level H to a low level L. As a result, the switch 74 selects the latch signal of the main address FF 82 ("0" side).

The main data FF 78 latches the data signal DS (A[0] to A[7]) corresponding to the monitoring address signal (a[0] to a[7]) output from the memory 11 at time T61 in synchronization with the main clock signal 105. As a result, the data signal DS (A[0] to A[7]) is output to the bus 13.

The memory 11 outputs the data signal DS (D[0] to D[7]) corresponding to the address signal AS (d[0] to d[7]) latched on the main data FF 82 at time T61.

The main address FF 82 latches the validity signal YS having a high level H from the bus 13 and the address signal (y[0] to y[7]) in synchronization with the main clock signal 105.

Meanwhile, the scan control unit 14 of FIG. 13 causes the SS scan mode signal 101 to switch from "000" to "010" in response to a rising edge of the internal snapshot start signal 402 at time T61.

Through the switching of the SS scan mode signal 101, the operation of the memory interface 10 switches from the idle mode to the snapshot mode. In the snapshot mode, the memory interface 10 performs a transitional operation until the operation of the scan-out mode described below starts.

The mode control circuit 81 causes the snapshot signal 107 to switch to a high level H based on the SS scan mode signal 101 set to "010." As a result, the switches 70 and 77 select a signal of the scan chain interconnect 15 ("1" side).

[Scan-Out Mode (Time T63 to T70)]

At time T63 after a single clock of the clock signal 104 elapses from time T62, the scan control unit 14 of FIG. 13 causes the SS scan mode signal 101 to switch from "010" to "011." At the same time, the scan control unit 14 outputs the SS scan clock signal 102 having a period twice that of the clock signal 104.

Due to the switching of the SS scan mode signal 101, the operation of the memory interface 10 switches from the snapshot mode to the scan-out mode.

In this case, the test mode controller 8 of FIG. 13 outputs the test mode signal 103 having a high level H in response to the test start signal which indicates test start. This test start signal is output from the debug tool 1 in order to start the scan-out operation of the main address FF 82 and the main data FF 78.

The mode control circuit 81, first, outputs the clock signal 104 as a sub-clock signal 106 and retains the address set signal 403 at a low level L based on the SS scan mode signal 101 set to "011" and the test mode signal 103 having a high level H.

As a result, the switch 72 retains selection of the address signal AS from the bus 13 ("0" side) based on the address set signal 403 having a low level L.

The subsidiary data FF 79 latches the data signal DS (D[0] to D[7]) output from the memory 11 at time T62 in synchronization with the sub-clock signal 106.

The memory 11 outputs the data signal DS (Y[0] to Y[7]) corresponding to the address signal AS (y[0] to y[7]) latched on the main address FF 82 at time T62.

The subsidiary address FF 73 latches the address signal AS (r[0] to r[7]) from the bus 13 in synchronization with the sub-clock signal 106.

Meanwhile, based on the SS scan mode signal 101 set to "011" and the test mode signal 103 having a high level H, the mode control circuit 81 outputs the SS scan clock signal 102 as a main clock signal 105, retains the snapshot signal 107 at a high level H, and sets the flip-flop selection signal 108 to a high level H.

As a result, the switches 70 and 77 retains a signal of the scan chain interconnect 15 ("1" side) based on the snapshot signal 107 having a high level H. In addition, the switch 74 selects the latch signal of the subsidiary address FF 73 ("1" side), and the switch 80 selects the latch signal of the subsidiary data FF 79 ("1" side).

As a result, the data signal DS (D[0] to D[7]) latched on the subsidiary data FF 79 is output to the bus 13. In addition, as described below, after time T64, the latch signal of the subsidiary address FF 73 obtained by latching the address signal AS from the bus 13 is supplied to the memory 11 through switching of the switch 74, and the latch signal of the subsidiary data FF 79 obtained by latching the data signal DS from the memory 11 is output to the bus 13 through switching of the switch 80, so that the memory interface 10 continuously performs the normal operation.

Based on the states of the switches 70 and 77, each flip-flop AMF0 to AMF7 of the main address FF 82 and each flip-flop DMF0 to DMF7 of the main data FF 78 latch the latch signals of the flip-flops of the preceding stage through the scan chain interconnect 15 in synchronization with the main clock signal 105. That is, the scan-out operation of the main address FF 82 and the main data FF 78 starts. Therefore, at time T63, the latch signal of the flip-flop DMF7 in the main data FF 78 at time T62, that is, the most significant bit "A[7]" of the data signal DS (A[0] to A[7]) of the flip-flop DMF7 in the main data FF 78 at time T62 is output from the scan-out terminal 18 of FIG. 13.

At time T64, the subsidiary data FF 79 latches the data signal DS (Y[0] to Y[7]) output from the memory 11 at time T63 in synchronization with the sub-clock signal 106. As a result, the data signal DS (Y[0] to Y[7]) is output to the bus 13.

The memory 11 outputs the data signal DS (R[0] to R[7]) corresponding to the address signal AS (r[0] to r[7]) latched on the subsidiary address FF 73 at time T63.

The subsidiary address FF 73 latches the address signal AS (t[0] to t[7]) from the bus 13 in synchronization with the sub-clock signal 106.

In this manner, the memory interface 10 continuously performs the normal operation using the subsidiary address FF 73 and the subsidiary data FF 79.

Similar to time T63, at time T65, each flip-flop AMF0 to AMF7 of the main address FF 82 and each flip-flop DMF0 to DMF7 of the main data FF 78 latch the latch signals of the flip-flops of the preceding stage through the scan chain interconnect 15 in synchronization with the main clock signal 105. As a result, at time T64, the latch signal "A[6]" of the flip-flop DMF7 at time T63 is output from the scan-out terminal 18.

The subsidiary data FF 79 latches the data signal DS (R[0] to R[7]) output from the memory 11 at time T64 in synchronization with the sub-clock signal 106. As a result, the data signal DS (R[0] to R[7]) is output to the bus 13.

The memory 11 outputs the data signal DS (T[0] to T[7]) corresponding to the address signal AS (t[0] to t[7]) latched on the subsidiary address FF 73 at time T64.

The subsidiary address FF 73 latches the address signal AS (q[0] to q[7]) from the bus 13 in synchronization with the sub-clock signal 106.

In this manner, after time T64, the memory interface 10 performs a scan-out operation of the latch signals of the main address FF 82 and the main data FF 78 while the normal operation is continuously performed.

[Return Mode (Time 171)]

At time T70, the latch signal as a scan-out target is only set to "y[0]." The test mode controller 8 causes the test mode signal 103 to switch from a high level H to a low level L in response to the test start signal which indicates test termination. This test start signal is output from the debug tool 1 in order to terminate the scan-out operation of the main address FF 82 and the main data FF 78.

As a result, at time T71, the scan control unit 14 causes the SS scan mode signal 101 to switch from "011" to "001" and causes the operation of the memory interface 10 to switch from the scan-out mode to the return mode. In the return mode, the memory interface 10 performs a transitional operation until the operation of the idle mode starts.

First, the mode control circuit 81 outputs the clock signal 104 as a sub-clock signal 106, retains the flip-flop selection signal 108 at a high level H, and retains the address set signal 403 at a low level L.

As a result, the switch 72 retains selection of the address signal AS from the bus 13 ("0" side) based on the address set signal 403 having a low level L. The switch 74 retains selection of the latch signal of the subsidiary address FF 73 ("1" side) based on the flip-flop selection signal 108 having a high level H. In addition, the switch 80 retains selection of the latch signal of the subsidiary data FF 79 ("1" side) based on the flip-flop selection signal 108 having a high level H.

The subsidiary data FF 79 latches the data signal DS (Z[0] to Z[7]) output from the memory 11 at time T70 in synchronization with the sub-clock signal 106. As a result, the latched data signal DS (Z[0] to Z[7]) is output to the bus 13.

The memory 11 outputs the data signal DS (E[0] to E[7]) corresponding to the address signal (e[0] to e[7]) latched on the subsidiary address FF 73 at time T70. The subsidiary address FF 73 latches the address signal AS (u[0] to u[7]) from the bus in synchronization with the sub-clock signal 106.

Meanwhile, the mode control circuit 81 outputs the SS scan clock signal 102 as a main clock signal 105 and sets the snapshot signal 107 to a low level L.

As a result, the switch 70 selects the address signal AS from the bus 13 ("0" side) based on the snapshot signal 107 having a low level L. In addition, the switch 77 selects the data signal DS from the memory 11 based on the snapshot signal 107 having a low level L ("0" side).

[Idle Mode (Time 172)]

At time T72 after a single clock of the clock signal 104 elapses from time T71, the scan control unit 14 of FIG. 13 causes the SS scan mode signal 101 to switch from "01" to "00" and causes the memory interface 10 to switch from the return mode to the idle mode. At the same time, the scan control unit 14 retains the SS scan clock signal 102 at a low level L.

First, the mode control circuit 81 outputs the clock signal 104 as a main clock signal 105 and outputs the test mode signal 103 having a low level L as a snapshot signal 107.

As a result, the switch 70 retains selection of the address signal AS from the bus 13 ("0" side) based on the snapshot signal 107 having a low level L. The switch 77 retains selection of the data signal DS from the memory 11 ("0" side) based on the snapshot signal 107 having a low level L.

Therefore, the main data FF 78 latches the data signal DS (E[0] to E[7]) output from the memory at time T71 in synchronization with the main clock signal 105. As a result, the data signal DS (E[0] to E[7]) is output to the bus 13.

The memory 11 outputs the data signal DS (U[0] to U[7]) corresponding to the address signal AS (u[0] to u[7]) latched on the subsidiary address FF 73 at time T71.

The main address FF 71 latches the address signal AS (b[0] to b[7]) from the bus 13 in synchronization with the main clock signal 105.

Meanwhile, the mode control circuit 81 sets the sub-clock signal 106 to a low level L, sets the flip-flop selection signal 108 to a low level L, and retains the address set signal 403 at a low level L.

As a result, the switch 72 retains selection of the address signal AS from the bus 13 ("0" side) based on the address set signal 403 having a low level L. The switch 74 selects the main address FF 71 ("0" side) based on the flip-flop selection signal 108 having a low level L. In addition, the switch 80 selects the main data FF 78 ("0" side) based on the flip-flop selection signal 108 having a low level L.

Since the switches 70, 72, 74, 77, and 80 after time T72 have the same selection states as those of the idle mode at time T60, the memory interface 10 can perform the normal operation using the main address FF 82 and the main data FF 73.

As described above, in FIG. 26, if the main address FF 82 does not latch a valid address signal AS in the idle mode after the subsidiary address FF 73 latches the monitoring address signal in the set mode, the monitoring address signal is input to the memory 11, and the data signal DS corresponding to the address signal AS identical to the monitoring address signal is latched on the main data FF 78. At the same time, a switching operation from the idle mode to the scan-out mode starts in order to scan out the data signal DS. In addition, in the scan-out mode, the memory interface 10 scans out the data signal DS corresponding to the monitoring address signal, that is, data for a desired address from the main data FF 78 while the normal operation is continuously performed using the subsidiary address FF 73 and the subsidiary data FF 79.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A semiconductor device comprising:
    a scan chain through that latch signals of a plurality of latches are output;
    a first switch that selects any one of an output signal of a combinational circuit and a signal of the scan chain;
    a first latch that is inserted into the scan chain and receives an output signal of the first switch;
    a second latch that receives an output signal of the combinational circuit; and
    a second switch that receives a latch signal of the first latch and a latch signal of the second latch, selects any one of the latch signal of the first latch and the latch signal of the second latch, and supplies the selected one to a combinational circuit in a following stage.

2. The semiconductor device according to claim 1, wherein a plurality of scan units are provided, each of the scan units including the combinational circuit, the first and second switches, and the first and second latches,
    an output of the second switch of the scan unit in a preceding stage is input to the combinational circuit of the scan unit in a following stage, and
    a latch signal of the first latch of the scan unit in the preceding stage and the first switch of the scan unit in a following stage are connected through the scan chain.

3. The semiconductor device according to claim 1, further comprising a control unit that controls switching an operation mode between
    an idle mode in which the first switch selects an output signal of the combinational circuit, the first latch latches an output signal of the combinational circuit through the first switch, and the second switch selects a latch signal of the first latch, and
    a scan-out mode in which the first switch selects a signal of the scan chain, a latch signal of the first latch is output through the scan chain, the second latch latches an output signal of the combinational circuit, and the second switch selects a latch signal of the second latch.

4. The semiconductor device according to claim 3, wherein the control unit switches the operation mode from the idle mode to the scan-out mode at any timing and switches from the scan-out mode to the idle mode after predetermined time elapses.

5. The semiconductor device according to claim 4, wherein the control unit switches the operation mode from the idle mode to the scan-out mode through a snapshot mode in which the first latch latches an output signal of the combinational circuit and the first switch switches selection to a signal of the scan chain, and
    in the scan-out mode after the snapshot mode, the second latch latches an output signal of the combinational circuit and the second switch switches selection to a latch signal of the second latch.

6. The semiconductor device according to claim 4, wherein the control unit switches the operation mode from the scan-out mode to the idle mode through a return mode in which the second latch latches an output signal of the combinational circuit and the first switch switches selection to an output signal of the combinational circuit, and
    in the idle mode after the return mode, the first latch latches an output signal of the combinational circuit and the second switch switches selection to a latch signal of the first latch.

7. The semiconductor device according to claim 3, wherein the control unit switches the operation mode to an alternative mode in which the second latch latches an output signal of the combinational circuit and the second switch switches selection to a latch signal of the second latch.

8. The semiconductor device according to claim 3, further comprising:
    a subsidiary scan chain through that latch signals of a plurality of the second latches are input or output; and
    a third switch that is provided between the combinational circuit and the second latch and selects any one of an output signal of the combinational circuit and a signal of the subsidiary scan chain,
    wherein the control unit switches the operation mode to a scan test mode in which the third switch selects a signal of the subsidiary scan chain, the second latch latches a signal of the subsidiary scan chain through the third switch, and a latch signal of the second latch is output through the subsidiary scan chain.

9. A debug system comprising:
the semiconductor device according to claim 3, and
a debug unit that supplies the control unit with a switching signal for switching the operation mode from the idle mode to the scan-out mode and is supplied with a latch signal of the first latch in the scan-out mode.

10. A debug system comprising:
the semiconductor device according to claim 8; and
a debug unit that supplies the control unit with a switching signal for switching the operation mode from the idle mode to the scan-out mode, is supplied with a latch signal of the first latch in the scan-out mode, supplies the control unit with a switching signal for switching the operation mode from the idle mode to the scan test mode, and is supplied with a latch signal of the second latch in the scan test mode.

11. A method of testing a semiconductor device including a scan chain through that latch signals of a plurality of latches are output, a first switch that selects any one of an output signal of a combinational circuit and a signal of the scan chain, a first latch that is inserted into the scan chain and receives an output signal of the first switch, a second latch that receives an outputs signal of the combinational circuit, and a second switch that receives a latch signal of the first latch and a latch signal of the second latch, selects any one of the latch signal of the first latch and the latch signal of the second latch, and supplies the selected one to a combinational circuit in a following stage subsequent to the combinational circuit,
the method comprising:
an idle mode process in which the first switch selects an output signal of the combinational circuit, an output signal of the combinational circuit is latched on the first latch, the second switch selects the latch signal of the first latch, and the latch signal of the first latch is input to the combinational circuit in the following stage; and
a scan-out mode process in which the first switch selects a signal of the scan chain, the latch signal of the first latch is output through the scan chain, the second latch latches an output signal of the combinational circuit, the second switch selects the latch signal of the second latch, and the latch signal of the second latch is input to the combinational circuit in the following stage.

12. The method according to claim 11, further comprising:
a snapshot mode process in which the first latch latches an output signal of the combinational circuit, and the first switch switches selection to a signal of the scan chain when a process switches from the idle mode process to the scan-out mode process; and
a return mode process in which the second latch latches an output signal of the combinational circuit, and the first switch switches selection to an output signal of the combinational circuit when a process switches from the scan-out mode process to the idle mode process,
wherein, in the scan-out mode process after the snapshot mode process, the second latch latches an output signal of the combinational circuit, and the second switch switches selection to a latch signal of the second latch, and
in the idle mode process after the return mode process, the first latch latches an output signal of the combinational circuit, and the second switch switches selection to the latch signal of the first latch.

13. A semiconductor device comprising:
a memory;
a scan chain through that latch signals of a plurality of latches are output;
a first switch that selects any one of an address signal of the memory from a bus and a signal of the scan chain;
a first latch that is inserted into the scan chain and receives an output signal of the first switch;
a second switch that selects any one of the address signal and a signal of the scan chain;
a second latch receives an output signal of the second switch;
a third switch that receives a latch signal of the first latch and a latch signal of the second latch, selects any one of the latch signal of the first latch and the latch signal of the second latch, and supplies the selected one to the memory in a following stage;
a fourth switch that selects any one of a data signal from the memory and a signal of the scan chain;
a third latch that is inserted into the scan chain and receives an output signal of the fourth switch;
a fourth latch that receives the data signal; and
a fifth switch that receives a latch signal of the third latch and a latch signal of the fourth latch, selects any one of the latch signal of the third latch and the latch signal of the fourth latch, and supplies the selected one to the bus.

14. The semiconductor device according to claim 13, further comprising a control unit that controls switching an operation mode between
an idle mode in which the first switch selects the address signal, the first latch latches the address signal input through the first switch, the third switch selects a latch signal of the first latch, the fourth switch selects an output signal of the memory, the third latch latches the data signal input through the fourth switch, and the fifth switch selects a latch signal of the third latch,
a set mode in which the second switch selects a monitoring address signal of the scan chain, and the second latch latches the monitoring address signal input through the second switch, and
a scan-out mode in which the first switch selects a signal of the scan chain, a latch signal of the first latch is output through the scan chain, the second switch selects the address signal, the second latch latches the address signal input through the second latch, the third switch selects a latch signal of the second latch, the fourth switch selects a signal of the scan chain, a latch signal of the third latch is output through the scan chain, the fourth latch latches the data signal, and the fifth switch selects a latch signal of the fourth latch.

15. The semiconductor device according to claim 14, wherein the control unit controls switching the operation mode from the idle mode to the scan-out mode when a latch signal of the first latch is identical to the monitoring address signal latched on the second latch in the set mode after the operation mode switches from the set mode to the idle mode, and
the third latch latches the data signal corresponding to the monitoring address signal output from the memory when the operation mode switches from the idle mode to the scan-out mode.

16. The semiconductor device according to claim 14, wherein the control unit controls switching the operation mode from the idle mode to the scan-out mode when the first latch does not latch a valid address signal after the operation mode switches from the set mode to the idle mode,
the monitoring address signal latched on the second latch is input to the memory through the third latch when the operation mode switches from the idle mode to the scan-out mode, and the third latch latches the data signal that is corresponding to the monitoring address signal and is output from the memory when the operation mode switches from the idle mode to the scan-out mode.

* * * * *